(12) United States Patent
Kim et al.

(10) Patent No.: US 7,397,131 B2
(45) Date of Patent: *Jul. 8, 2008

(54) SELF-ALIGNED SEMICONDUCTOR CONTACT STRUCTURES

(75) Inventors: Seong-Ho Kim, Gyeonggi-do (KR); Dong-Gun Park, Gyeonggi-do (KR); Chang-Sub Lee, Gyeonggi-do (KR); Jeong-Dong Choe, Gyeonggi-do (KR); Sung-Min Kim, Incheon Metropolitan (KR); Shin-Ae Lee, Gyeonggi-do (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/396,819

(22) Filed: Apr. 3, 2006

(65) Prior Publication Data

US 2006/0192255 A1    Aug. 31, 2006

Related U.S. Application Data

(63) Continuation of application No. 10/695,061, filed on Oct. 28, 2003, now Pat. No. 7,071,517.

(30) Foreign Application Priority Data

Oct. 31, 2002   (KR) ............................... 2002-66874

(51) Int. Cl.
*H01L 29/772* (2006.01)

(52) U.S. Cl. ..................... 257/775; 257/382; 257/314

(58) Field of Classification Search ................. 257/314, 257/377, 382, 383, 775
See application file for complete search history.

(56) References Cited

U.S. PATENT DOCUMENTS

| 5,874,331 | A | * | 2/1999 | Nishigohri | ................... | 438/231 |
| 6,284,596 | B1 | | 9/2001 | Sung et al. | ................... | 438/257 |
| 6,294,449 | B1 | | 9/2001 | Wu et al. | ..................... | 438/597 |
| 6,326,270 | B1 | * | 12/2001 | Lee et al. | .................... | 438/279 |

(Continued)

FOREIGN PATENT DOCUMENTS

JP    2001-230383    8/2001

(Continued)

OTHER PUBLICATIONS

Notification of First Office Action (2sheets) and text of the First Office Action (5sheets) from the Patent Office of the Republic of China for corresponding Chinese Application No. 200310104557.1, and an English language translation of the First Office Action (Notification, 3 sheets, text, 7 sheets).

*Primary Examiner*—Matthew C Landau
(74) *Attorney, Agent, or Firm*—Myers, Bigel, Sibley & Sajovec, P.A.

(57) ABSTRACT

A self-aligned contact structure and a method of forming the same include selected neighboring gate electrodes with adjacent sidewalls that are configured to angle toward each other. The angled surfaces of the gate electrodes can be protected using a liner layer that can extend the length of the contact window to define the sidewalls of the contact window.

17 Claims, 18 Drawing Sheets

U.S. PATENT DOCUMENTS

| | | | |
|---|---|---|---|
| 6,734,564 B1 | 5/2004 | Cronin et al. | 257/774 |
| 7,071,517 B2 * | 7/2006 | Kim et al. | 257/382 |
| 2002/0079492 A1 | 6/2002 | Koga | 257/66 |
| 2002/0195672 A1 | 12/2002 | Lee et al. | 257/408 |

FOREIGN PATENT DOCUMENTS

| | | |
|---|---|---|
| JP | 2002222858 A | 8/2002 |
| KR | 102002-0062796 | 7/2002 |

* cited by examiner

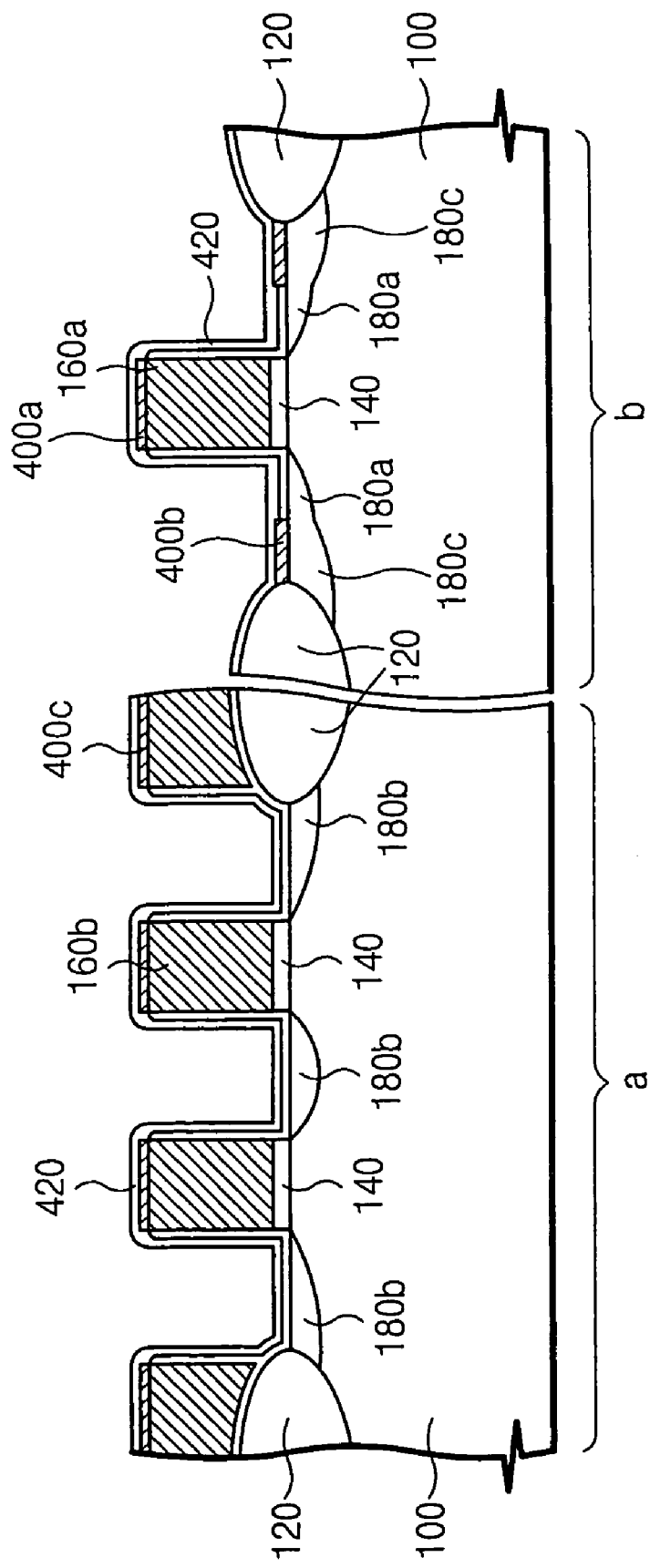

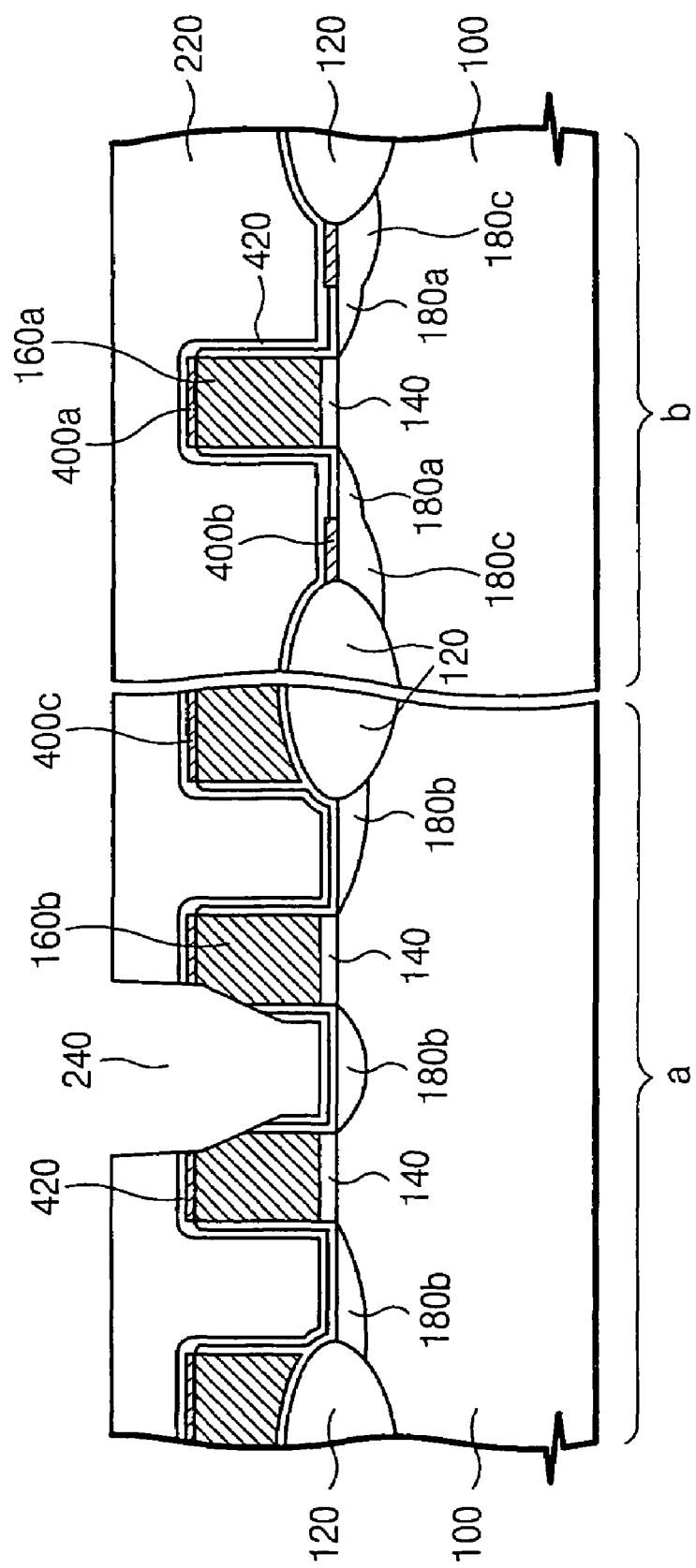

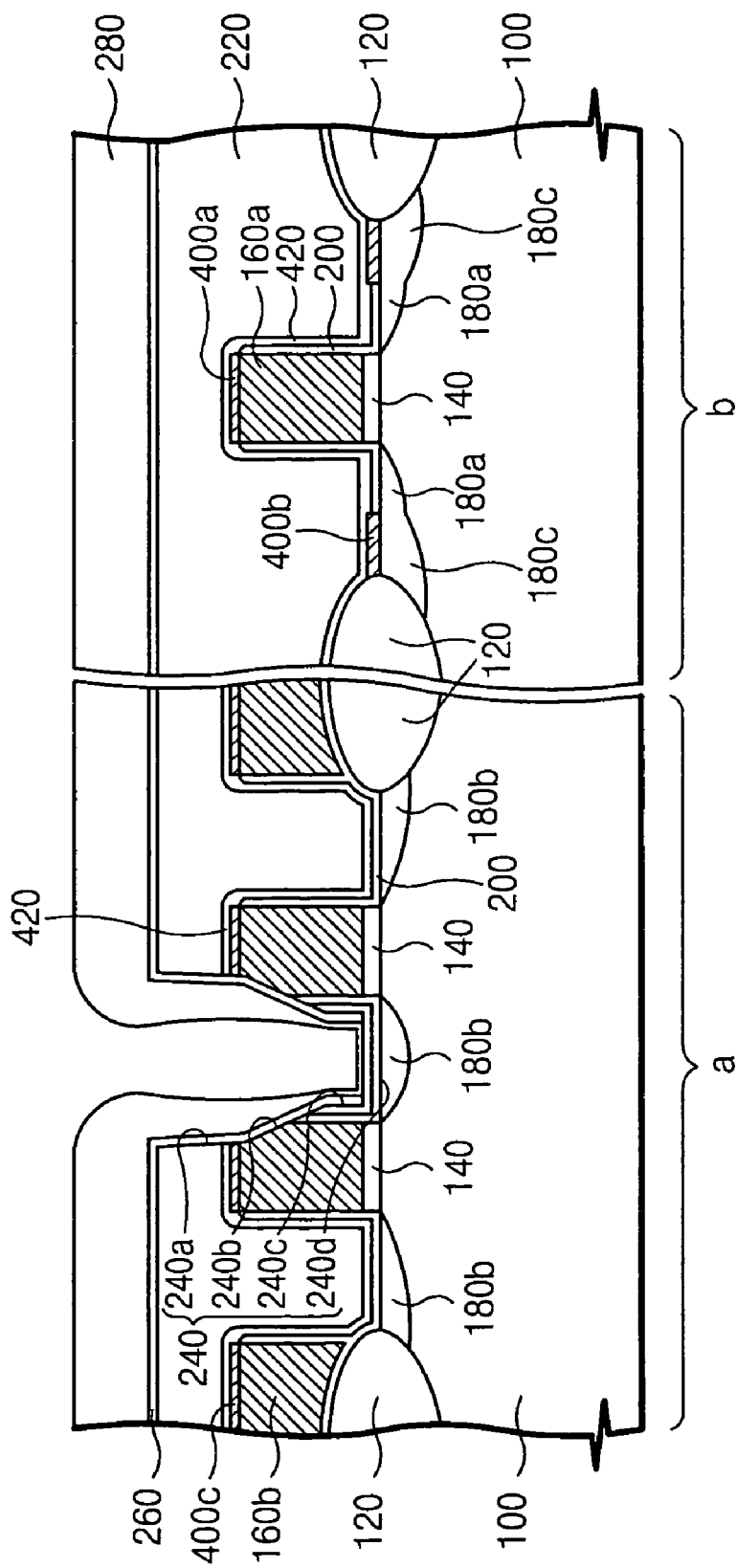

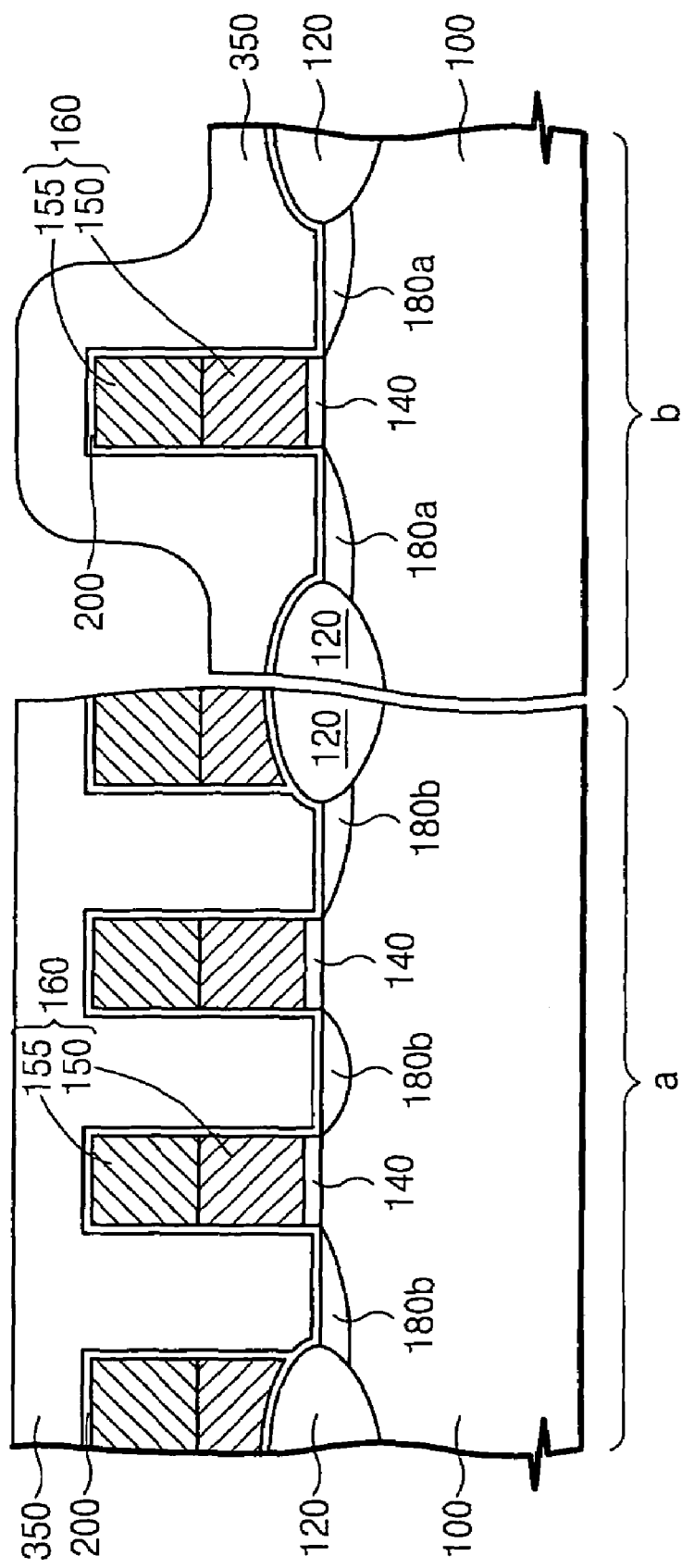

SELF-ALIGNED SEMICONDUCTOR CONTACT STRUCTURES

RELATED APPLICATIONS

This application is a continuation of U.S. patent Ser. No. 10/695,061, filed Oct. 28, 2003 now U.S. Pat. No. 7,071,517 which claims the benefit of priority to Korean Patent Application 2002-66874, filed on Oct. 31, 2002, the contents of which are incorporated by reference herein in their entirety.

FIELD OF THE INVENTION

The present invention relates to semiconductor devices and methods of forming the same and more specifically to lower electrode contact structures over an underlying layer and methods of forming the same.

BACKGROUND OF THE INVENTION

Semiconductor device manufacturing typically includes alternately forming conductive layers (or conductive regions) and insulation layers, and electrically connecting upper and lower conductive layers that are otherwise electrically insulated by the insulation layers, using contacts that are formed in predetermined regions of the insulation layer.

For example, when manufacturing a semiconductor memory device, conductive regions between gate electrodes which include source and drain regions, can be electrically connected to a bit line or a storage node. To provide this feature after forming the gate electrode, an insulation layer is typically formed and then etched through a photolithographic etching process to form a contact window that exposes the drain region. Then, the contact window may be filled with conductive material to form what can be referred to as a "bit line" contact plug. The manufacturing process can also include forming a bit line that is electrically connected to the bit line contact plug, then depositing an insulation layer again, and etching the insulation layer to form a contact window that exposes the source region. Then, a storage node contact plug is formed. A storage node can be formed that is electrically contacted to the storage node contact plug.

However, the distance between adjacent elements in the semiconductor substrate (i.e., the gate electrodes) can be reduced or made more narrow as manufacturing procedures and/or processes accommodate increased density configurations. As a result, the aspect ratio of the contact window that extends through the insulation layer may increase, such that the contact window may not entirely penetrate the insulation layer during the photolithographic process. In addition, a gate electrode may be exposed during the contact window etching process, particularly if there is misalignment, thereby potentially causing electrical bridging between the gate electrode and the contact plugs.

Accordingly, self-aligned contact technologies have been used in order to decrease the aspect ratio of the contact window or hole and to inhibit or prevent the electrical bridge. The self-aligned contact technologies typically use a material property between two separate insulating layers to establish a different etch rate with respect to a predetermined etch gas. Briefly explained, one insulation layer (e.g., a silicon nitride layer) can be formed on a top and sidewalls of the gate electrode in order to protect the gate electrode. An interlayer insulation layer (e.g., a silicon oxide layer) having etch selectivity with respect to the one insulation layer can be used. Then, the photolithographic process can be performed to selectively etch the interlayer insulation layer, thereby forming a contact window that exposes conductive regions between the gate electrodes. After this step, conductive materials can be filled in the contact window to form self-aligned contact pads. According to these conventional self-aligned contact technologies, the gate electrode may be protected by the one insulation layer (such as the silicon nitride layer), so that even in the presence of misalignment, the gate electrodes, especially the top thereof, may not be exposed when the interlayer insulation layer (the silicon oxide layer) is etched.

In conventional self-aligned contact technologies, in order to increase the likelihood that the gate electrode is protected during fabrication, a silicon nitride capping layer can be formed on the top of the gate electrode and silicon nitride sidewall spacers can be formed on the sidewalls of the gate electrodes. Unfortunately, these spacers and the capping layer may cause problems, examples of which will be explained hereinafter.

For example, the silicon nitride capping layer typically increases a height of the stacked layer structure used to form the gate electrode(s). In addition, the space between neighboring gate electrodes may decrease due to the silicon nitride sidewall spacers. Therefore, during fabrication, the space between neighboring gate electrodes may not fill properly with the interlayer insulating layer, thereby potentially causing void and undesired electrical bridging in the subsequent process. Moreover, because the gate-stacked structure is relatively high, ion implantation may be difficult to perform. The conductive region (i.e., the source and drain regions), which is exposed by the self-aligned contact window, is typically limited in an area by the sidewall spacers. As a result, contact resistance between the source/drain region and self-aligned contact pad can increase. In addition, the gate electrode can be surrounded by the silicon nitride layer, such that loading capacitance may increase and the operation speed of the device may decrease.

Meanwhile, in the case of a transistor composing a logic circuit, a self-aligned silicide layer (i.e., salicide) may be used for high-speed operation. That is, refractory metal can be formed on top of the gate electrode and on the source/drain regions at both sides thereof. The refractory metal and silicon can then be thermally treated to form a silicide layer based on the reaction between the refractory metal and the silicon. When a logic circuit and a memory device are formed in the same chip for a high-speed operation and a highly integrated memory device, the conventional self-aligned contact techniques may cause several problems.

During operation, a top of the gate electrode of the memory device should be protected with an insulating layer, such as a silicon nitride layer, in order to use a conventional self-aligned contact method to form the memory device. However, in case of the logic device, the top of the gate should typically be exposed for forming the silicide layer. To compensate for the two disparate features, the fabrication process can become increasingly complicated. In addition, when forming the memory device, the silicide layer may be formed in order to secure a low resistance. However, the top of the gate may be protected by silicon nitride such that it may be difficult to form a silicide layer. In addition, when forming the logic device, the silicide layer can be formed in the source/drain regions, such that the gate sidewall spacers may be formed relatively thick to make the source/drain regions have an increased length. In other words, the length may depend on the width or thickness of the gate sidewall spacers. However, the sidewall spacers should be formed relatively thin at the cell region in order to inhibit generating voids.

SUMMARY OF THE INVENTION

Embodiments of the present invention are directed to self-aligned contact structures and methods of forming the same. Certain embodiments of the present invention are directed to methods of forming self-aligned contact structures at a cell region and simultaneously forming a silicide layer on top surfaces of a gate electrode at a cell array region and a peripheral region.

In particular embodiments, the self-aligned contact structure of the present invention includes gate electrodes with top and side surfaces covered by a thin nitride liner. This configuration is in contrast to a conventional structure where the gate electrode can be surrounded by a silicon nitride capping layer and sidewall spacers. Accordingly, in particular embodiments, an aspect ratio of a self-aligned contact window can decrease, a contact resistance can be lowered, and a loading capacitance can be reduced. In addition, void(s) can be inhibited and/or prevented while an interlayer insulation layer is deposited.

In certain embodiments, a self-aligned contact structure of the present invention includes gate electrodes, a first liner layer, a self-aligned contact pad, an interlayer insulation layer and a second liner layer. The gate electrodes are disposed on a semiconductor substrate, separated from each other, and interposed with a gate insulation layer therebetween. Upper portions of respective gate electrodes may have inclined profiles, such that the width of the upper portions is narrower than the width of the lower portions. Together, the first and second liner layers are selectively disposed on the semiconductor substrate to surround certain surfaces (typically the first liner layer surrounds a major portion of the target surfaces and the second liner layer surrounds a minor portion of the target surfaces with the gate electrodes having only a small dual liner coverage area to thereby surround all of the exposed upper surfaces) of the gate electrodes.

The self-aligned contact pad is electrically connected to the exposed semiconductor substrate between selected neighboring gate electrodes, and disposed to contact at least portions of the second liner layer. That is, the self-aligned contact pad is disposed between selected pairs of adjacent sidewalls of neighboring gate electrodes and has a length sufficient to protrude above the top surface of the gate electrodes. The interlayer insulation layer is disposed on the first liner layer about certain external portions of respective gate electrodes, and on the second liner layer above the top surface of the gate electrodes about the upper portions of sidewalls of the protruding self-aligned contact pad such that the second liner layer is interposed between the contact pad and the interlayer insulation layer.

In particular embodiments, the present invention can further include a buffer insulation layer that is disposed between the second liner layer and at least the upper portion of the self-aligned contact pad.

The first liner layer and the second liner layer can comprise silicon nitride and the interlayer insulation layer and the buffer insulation layer can comprise silicon oxide. In an exemplary embodiment, the interlayer insulation layer is a silicon oxide layer having good step coverage and the buffer insulation layer may be a silicon oxide layer having poor step coverage.

Certain embodiments of the present invention are directed toward self-aligned contact structures. The structures include: (a) a plurality of spaced apart gate electrodes disposed on a semiconductor substrate with the gate electrodes having opposing first and second sidewalls and top and bottom surfaces, wherein adjacent sidewalls of selected neighboring gate electrodes have respective upper portions that angle toward each other to present a sloped profile; (b) a first liner layer that is disposed on the semiconductor substrate and covers one of the first and second sidewalls, a minor portion of the other sidewall and a major portion of the top surface of the gate electrodes; (c) a plurality of self-aligned contact pads that are separately electrically connected to selected regions of the semiconductor substrate, each self-aligned contact pad having opposing upwardly extending sidewalls, wherein a respective self-aligned contact pad is positioned between the selected neighboring gate electrodes, and have a length sufficient so that the self-aligned contact pads extend a distance above the top surface of the gate electrodes; (d) an interlayer insulation layer disposed on the first liner layer above the top surface and about selected sidewalls of respective gate electrodes, the selected sidewalls of respective gate electrodes being those sidewalls that are positioned away from the self-aligned contact pad electrodes; and (e) a second liner layer disposed on the angled portions of the adjacent sidewalls of neighboring gate electrodes.

Certain embodiments include methods of forming a self-aligned contact window configured to hold a self-aligned contact pad therein in communication with a semiconductor substrate. The methods include removing a selected portion of an interlayer insulation layer and then an underlying upper portion of adjacent sidewalls of first and second gate electrodes held proximate to each other on a semiconductor substrate to form first and second gate electrodes with sloped sidewalls that angle toward each other and define a portion of the shape of sidewalls of a self-aligned contact window configured to hold a self-aligned contact pad therein.

Other embodiments are directed to methods of forming the self-aligned contact structures. The methods can include: (a) forming gate electrodes that are spaced apart from each other on a semiconductor substrate; (b) forming a first liner layer on the semiconductor substrate and the gate electrodes; (c) forming an interlayer insulation layer over the first liner layer; (d) forming a contact window having opposing spaced apart sidewalls and a bottom by selectively etching the interlayer insulation layer with respect to the first liner layer; (e) forming a second liner layer over the interlayer insulation layer and the bottom and sidewalls of the contact window; (f) forming a buffer insulation layer to extend laterally a distance beyond the second liner layer to overhang in the contact window; (g) exposing the semiconductor substrate between adjacent gate electrodes by performing an etch back process to remove the buffer insulation layer and the second and first insulation layers at a bottom portion of the contact window; and (h) filling the contact window with conductive material to thereby substantially and/or entirely fill at least a lower portion of the contact window.

Different from the conventional method, in a method of forming the self-aligned contact according to embodiments of the present invention, a thin nitride liner may be formed on the gate electrode without forming a gate sidewall spacer nitride layer and a capping nitride layer. Therefore, during the etching of the interlayer insulation layer for forming the self-aligned contact window, a portion of the upper part of the gate electrode is etched, so that the self-aligned contact window have an inclined profile. That is, because a thin nitride liner covers the gate electrodes, the upper part of the gate is continuously attacked to weaken during the etching of the interlayer insulation layer. Therefore, the thin nitride layer on the upper part of the gate electrode is etched, such that the upper part of the gate electrode is exposed and etched. As a result, the contact window having inclined profile is formed. Namely, upper part of the gate electrode is narrower than lower part thereof. A nitride liner can be additionally formed to protect the exposed upper part of the gate electrode and then an insulation layer having poor step coverage is formed to cause overhang. The insulation layer can be formed thin on the bottom of the contact window and thicker on the sidewalls and the upper part of the contact window. Therefore, when etching is performed, the insulation layer and the nitride liner are etched to expose the conductive region because the insulation layer is formed thin on the bottom of the contact window. However, the insulation layer is formed thicker on the sidewalls, such that the nitride liner is not etched.

Yet other embodiments are directed toward an integrated circuit (such as a semiconductor) assembly. The assembly includes a plurality of gate electrodes disposed on a substrate, the gate electrodes having opposing sidewalls and top and bottom surfaces, wherein portions of selected adjacent sidewalls of neighboring electrodes (i.e., the sidewalls that face each other) angle generally downwardly and inwardly toward each other while the opposing sidewall of each of the selected sidewalls are substantially linear.

In particular embodiments, the assembly further includes a plurality of elongate contact windows, a respective one positioned between the selected adjacent sidewalls of neighboring electrodes, wherein the contact window sidewalls comprise an angled profile that correspond to the angled gate electrode sidewall configuration; and a contact pad disposed in each contact window, the contact pad extending generally downwardly and having a length that is greater than the height of the gate electrodes.

In particular embodiments, the assembly may also include a gate protection liner layer that extends in the contact window and covers the angled sidewall portion of a respective gate electrode, and a first liner layer that covers the remaining surfaces of the top and opposing sidewalls of the respective gate electrode.

Other embodiments are directed to semiconductor assemblies that include a conductive contact on a substrate in a recess adjacent to a gate electrode having a gate electrode sidewall and a top surface. The sidewall angling inwardly from the top surface to an intermediate portion of the sidewall toward the recess. The conductive contact has a height that extends above the top surface of the gate electrode.

According to embodiments of the invention, a height of the gate stacked structure and a distance therebetween may be increased, such that voids may be inhibited and/or prevented when the interlayer insulation layer is formed. Moreover, in certain embodiments, even though voids may occur, electrical bridging is inhibited and/or prevented because the nitride liner is formed after the etching of the interlayer insulation layer. In addition, the gate-stacked structure can have a relatively low height, so that the thickness of the material layer may also be relatively thin. Thus, manufacturing costs may be reduced and throughput may be increased.

In certain embodiments, methods of forming the self-aligned contact structure can include the following operations. Gate electrodes are formed on a semiconductor substrate. The gate electrodes can run in parallel and separated from each other. A first liner layer is formed on the semiconductor substrate and on surfaces of the gate electrodes. An interlayer insulation layer is formed on the first liner layer. A contact window is formed by etching selectively the interlayer insulation layer with respect to the first liner layer. A second liner layer is formed on the resultant structure with the contact window and a buffer insulation layer is formed to cause overhang on the second liner layer, thereby forming the buffer insulation layer thin on a bottom of the contact window and thicker toward the sidewalls and upper part of the contact window. An etch back process is performed under the condition without etch selectivity between the buffer insulation layer and the liner layers to expose the semiconductor substrate between the gate electrodes. Conductive material is formed to fill the entire self-aligned contact window.

Depending on exemplary embodiments, before forming the conductive material, a step of removing the buffer insulation layer can be more performed. Therefore, an area of the upper part of the conductive material is widened that is filled in the contact structure, thereby increasing misalignment margin in a subsequent process.

In certain embodiments, the first liner and the second liner layer may be formed of a silicon nitride layer and the interlayer insulation layer may be formed an oxide layer having good step coverage. The buffer insulation layer may be formed of an oxide layer having poor step coverage.

While the interlayer insulation layer may be patterned to form the contact window, the upper part of the gate electrodes can be attacked by the etching and the first liner layer thereon can be simultaneously etched. Thus, the exposed upper part of the gate electrode can be etched to be inclined.

In certain embodiments, during an etch back process, under the condition without etch selectivity between the buffer insulation layer and the liner layers, the liner layers on the upper and intermediate sidewalls of the contact window can be protected by the buffer insulation layer while allowing the liner layers on the bottom of the contact window to be etched. The buffer insulation layer may remain on the upper sidewall of the temporary contact window, so that sidewall spacers are formed.

In particular embodiments, after forming the first liner layer and before forming the interlayer insulation layer, the following steps may be further performed: a sacrificial insulating layer is formed, the sacrificial insulation layer is etched back to expose the gate electrodes; a metal silicide layer is formed on the exposed gate electrodes; and the residual sacrificial insulation layer is removed. Different from the conventional method for forming a self-aligned contact, a capping nitride layer is not formed on top of the gate, such that the gate electrode is easily exposed and a silicide layer can be formed thereon.

Using the method for forming the self-aligned contact window, a silicide layer can be easily formed at the peripheral circuit area where a logic circuit is formed and at the cell array region where a memory element is formed.

In particular embodiments, certain methods can be carried out to simultaneously form a silicide layer on the upper part of the gate electrode at the cell array region and at the peripheral circuit region.

Certain embodiments are directed toward methods of forming a self-aligned contact. The methods include: (a) forming gate electrodes that are spaced apart from each other with a plurality of the gate electrodes positioned at a cell array region and at least one gate electrode positioned at a peripheral circuit region of the semiconductor substrate, respectively; (b) forming a first liner layer over the semiconductor substrate and surfaces of the gate electrodes; (c) forming a sacrificial insulation layer on the first liner layer in an amount sufficient to cover spaces between the gate electrodes of the cell array region; (d) etching back the sacrificial insulation layer so as to form temporary sidewall spacers on sidewalls of the at least one gate electrode at the peripheral circuit region; (e) forming a metal silicide layer at least on the semiconductor substrate exposed adjacent the temporary sidewall spacers; then (f) removing the sacrificial insulation layer remaining at the cell array region and the temporary sidewall spacers of the peripheral circuit region; (g) forming an interlayer insulation layer having a substantially planar top surface; (h) selectively etching the interlayer insulation layer with respect to the first liner layer to form at least one contact window in the cell array region between adjacent first and second gate electrodes, the contact window having opposing spaced apart sidewalls and a bottom; (i) forming a second liner layer on the sidewalls and bottom of the contact window; (j) forming a buffer insulation layer on the second liner layer so that the buffer insulation layer extends a lateral distance into the contact window to leave a gap space in the contact window, the buffer insulation layer having a greater thickness at a top portion of the sidewalls of the contact window than at a lower portion of the sidewalls of the contact window; (k) exposing the semiconductor substrate between the gate electrodes of the cell array region by performing an etch back process; and (l) filling at least a lower portion of the contact window with conductive material.

In certain embodiments, after forming the buffer insulation layer, in the etching back process, the liner layers on the upper and intermediate parts of the contact window are protected by the buffer insulation layer, but the liner layers on the bottom of the contact window are etched. Thus, the buffer insulation layer remains the upper and intermediate sidewalls of the contact window to form sidewall spacers.

In the above method(s), the following operations may be additionally carried out. After forming the gate electrodes, lightly doped impurity diffusion layers are formed in the semiconductor substrate at both sides of the gate electrodes by performing an ion implantation process. After forming the temporary sidewall spacers, heavily doped impurity diffusion layers, which are continued to the lightly doped impurity diffusion layers of the peripheral circuit region, are formed in the semiconductor substrate at both sides of the temporary sidewall spacers.

In the exemplary embodiment, the gate electrodes may be formed of polysilicon. At this time during an etch back process following the formation of the sacrificial insulation layer, the upper parts of the gate electrodes are exposed at the cell region and the peripheral circuit region, and the sacrificial insulation layer of the cell region remains on sidewalls of the gate electrodes and on the semiconductor substrate therebetween. Therefore, the metal silicide layer is formed on the exposed gate electrodes and on the heavily doped impurity diffusion layer.

In another exemplary embodiment, the gate electrodes may be formed of polysilicon and tungsten silicide or formed of polysilicon and tungsten that are sequentially stacked. In this case, during an etch back process following the formation of sacrificial insulation layer, the upper parts of gate electrodes are exposed at the cell region and the peripheral circuit region. The sacrificial insulation layer of the cell region remains on the sidewalls of the gate electrodes and the semiconductor substrate therebetween. Thus, the metal silicide layer may be formed only on the semiconductor substrate at both sides of the gate electrodes of the peripheral circuit region, that is, only on the heavily doped impurity diffusion layer.

After forming the sacrificial insulation layer and before performing the etch back process, the photoresist pattern covering the cell region may be further formed. In this case, a metal silicide layer may not be formed at the cell region.

After forming the metal silicide layer, a step of forming a protection liner layer may be further performed in order to protect the metal silicide layer.

In the above method(s), a step of removing the buffer insulation layer may be further performed. Thus, an area of the upper part of the self-aligned contact pad increases to be capable to improve a margin of the subsequent process.

In the above method, the first liner layer, the second liner layer and the shield liner layer are formed of silicon nitride. The sacrificial insulation layer and the buffer insulation layer are formed of silicon oxide. More specifically, the interlayer insulation layer is formed of oxide having good step coverage and the buffer insulation layer is formed of oxide having poor step coverage.

According to the method, with adjusting the thickness of the interlayer insulation layer, the temporary sidewall spacers, which are formed from the sacrificial insulation layer at the peripheral circuit region, can be easily formed relatively thick. In addition, an individual photolithographic etching process for forming a silicide layer at the cell region and the peripheral circuit region is not required, such that the process is simplified and a silicide layer can be more easily formed.

In certain embodiments, semiconductor assemblies with self-aligned contact pads can include a cell array region and a peripheral circuit region on the semiconductor substrate. The cell array region can include: (a) first and second gate electrodes disposed on a semiconductor substrate, the first and gate electrodes having opposing first and second sidewalls and top and bottom surfaces, wherein portions of the adjacent sidewalls of the first and second gate electrodes are configured to angle generally downwardly and inwardly toward each other; (b) a contact window positioned between the adjacent sidewalls of the first and second gate electrodes, wherein the contact window sidewalls comprise an angled profile that correspond to the angled gate electrode sidewalls; and (c) a contact pad disposed in the contact window, the contact pad extending generally downwardly and having a length that is greater than the height of the gate electrode. The peripheral circuit region is disposed on the semiconductor substrate spaced apart from the cell array region. The peripheral circuit region can include: (a) at least one gate electrode; (b) lightly doped impurity diffusion regions in the semiconductor substrate positioned on opposing sides of the at least one gate electrode; and (c) heavily doped impurity diffusion regions in the semiconductor substrate positioned on opposing sides of the at least one gate electrode so that the heavily doped impurity diffusion regions reside a further distance away from the at least one gate electrode and so that the heavily doped impurity diffusion regions abut the lightly doped impurity diffusion regions.

BRIEF DESCRIPTION OF THE DRAWINGS

FIGS. 4A through 4J are cross-sectional views showing operations of a method for simultaneously forming silicide layers in a cell region and in a peripheral circuit region using methods for forming a self-aligned contact structure and/or other intermediate and resultant structures in accordance with embodiments of the present invention.

FIGS. 5A through 5B are cross-sectional views showing operations of methods for simultaneously forming a silicide layer in a cell region and in a peripheral region using methods for forming a self-aligned contact structure and/or other structures in accordance with embodiments of the present invention.

DETAILED DESCRIPTION

The present invention will now be described more fully hereinafter with reference to the accompanying drawings, in which embodiments of the invention are shown. Like numbers refer to like elements and repeated explanation of identical elements may be avoided with reference to subsequent figures in the specification. In the figures, certain features, layers or components may be exaggerated for clarity. When a layer is referred to as being "on" another layer or substrate, it can be directly on the other layer or substrate, or intervening layers, films, coatings and the like may also be present unless the word "directly" is used which indicates that the feature or layer directly contacts the feature or layer. In addition, spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the terms "liner layer", formation of the "liner layer," or derivatives thereof, mean a layer that has a substantially uniform thickness along an entire target outline of a lower and/or underlying structure or a formation of the same. The liner layer may be configured to be substantially conformal to an underlying material layer or structure so as to provide substantially the same shaped profile as the underlying structure.

Figure 1:
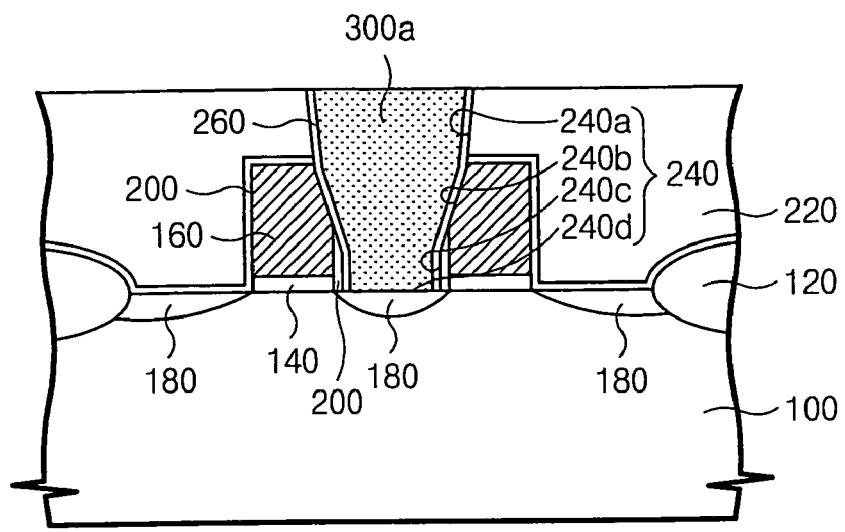
FIG. 1 is a cross-sectional view schematically showing a self-aligned contact structure in accordance with embodiments of the present invention.

FIG. 1 shows a cross-sectional view of a self-aligned contact structure in accordance with an exemplary embodiment of the present invention. Gate electrodes 160 can be configured to run substantially parallel with, but separated apart from, each other on a semiconductor substrate 100. Each of the gate electrodes 160 may comprise a polysilicon single-layered structure, a double-layered structure of polysilicon and tungsten silicide, and/or polysilicon and tungsten. In certain embodiments, such as when the gate electrode 160 comprises a polysilicon single-layered structure, a metal silicide layer may be formed on the polysilicon layer.

As also shown in FIG. 1, for electrical insulation, a gate oxide layer 140 can be interposed between the gate electrodes 160 and the semiconductor substrate 100. Impurity diffusion regions (i.e., conductive regions) 180 can be formed in the semiconductor substrate 100. The conductive regions 180 may be formed at both sides of the gate electrodes 160 as shown. An interlayer insulation and/or dielectric layer 220 can be disposed on the semiconductor substrate 100. A self-aligned contact window 240 can be configured to penetrate the interlayer insulation layer 220 to expose the impurity diffusion region 180 between the gate electrodes 160. The self-aligned contact window 240 can be configured to expose both the top of the gate electrode 160 and the impurity diffusion regions 180, respectively.

The self-aligned contact window 240 can be positioned intermediate adjacent gate electrodes 160 and configured with longitudinally extending opposing sidewalls that may extend to contact and/or terminate at the diffusion region 180. The sidewalls of the self-aligned contact window 240 can be defined by the interlayer insulation layer 220 and adjacent sides of neighboring gate electrodes 160. The bottom of the contact window 240 can end at and/or be formed by the impurity diffusion region 180. That is, the self-aligned contact window 240 includes a channel that has downwardly extending sidewalls that can be formed by the stacked configuration of the interlayer insulation layer 220, sidewalls of neighboring gate electrodes 160, the liner layer 200 formed over a lower portion of the gate electrode 160 sidewalls that terminate into a bottom formed by the impurity diffusion region 180.

Stated differently, an upper sidewall 240a of the self-aligned contact window 240 may be defined by an etched out portion of the interlayer insulation layer 220. An intermediate sidewall 240b of the self-aligned contact window 240 may be defined by an intermediate portion of the sidewall of a gate electrode 160. A lower sidewall 240c of the self-aligned contact window 240 can be defined by a liner layer 200 disposed on the lower sidewall of the gate electrode 160. A bottom 240d of the self-aligned contact window 240 can be defined by the impurity diffusion region 180.

The self-aligned contact window 240 exposes the upper portion of the gate electrode 160. In addition, as shown, the intermediate portion of the sidewall 240b of the contact window 240 can be defined by etching the innermost perimeter and/or boundary of the upper portion of adjacent gate electrodes 160, such that a profile of the contact window 240 may be inclined. That is, the upper portion of the gate electrode 160 and the corresponding intermediate portion of the contact window sidewall 240b have a profile with a slope that travels inwardly to narrow as the self-aligned contact window 240 approaches the impurity diffusion region 180 and widens as the contact window 240 approaches the upper portion of the gate electrodes 160. Thus, a bottom width of the gate electrode 160 is wider than a top width thereof.

In certain embodiments, the gate electrodes 160 can include at least one liner layer that conforms to and covers substantially the entire exposed perimeter and/or upper portion thereof (that is, both opposing sidewalls and the top of the gate electrode but not the bottom). As shown, the upper portion of the gate electrode 160 is covered by either a first liner layer 200 and/or a second liner layer 260. The second liner layer 260 is disposed on a minor portion of the perimeter, typically the upper and intermediate portion of one sidewall of the gate electrode 160 (i.e., the intermediate portion of the sidewall 240b of the self aligned contact window 240). The first liner layer 200 can be disposed on the remainder of the exposed perimeter of the gate electrode 160. As a result, the exposed perimeter of gate electrodes 160 are covered and/or surrounded by thin liner layers 200 and 260. In particular embodiments, the liner layer may be thin, which includes a layer that has a thickness of about 100 Å or less.

Figure 2:
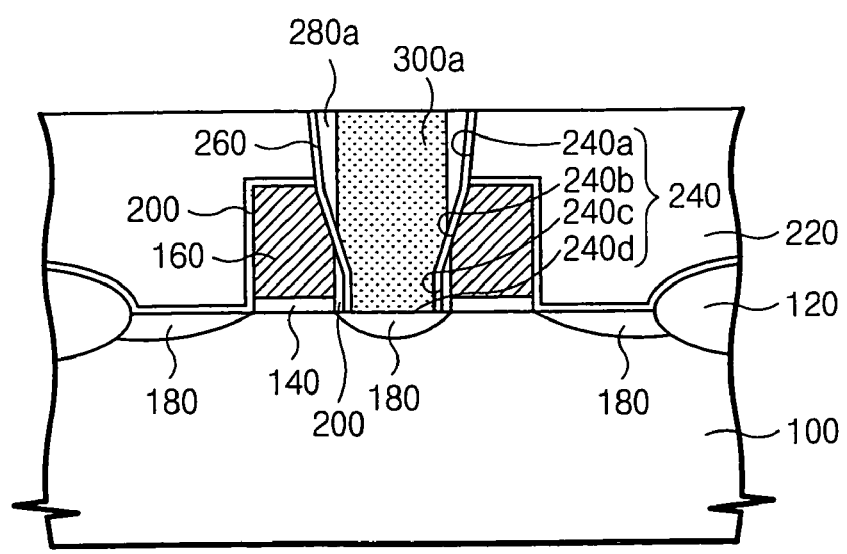
FIG. 2 is a cross-sectional view schematically showing a self-aligned contact structure and other structures in accordance with other embodiments of the present invention.

As shown in FIGS. 1 and 2, the second liner layer 260 can be configured to continuously extend from the upper sidewall 240a to the lower sidewall 240c of the self-aligned contact window 240.

The self-aligned contact window 240 can be substantially entirely filled with a conductive material (the conductive material can be disposed on and/or over the second liner layer 260) to form a self-aligned contact pad 300a. That is, the self-aligned contact pad 300a is electrically connected to the impurity diffusion region 180 between adjacent gate electrodes 160 but electrically insulated from the gate electrodes 160 by the liner layers 200 and 260.

In certain embodiments, the contact structure comprises liner layers 200 and 260, which can include a silicon nitride layer, and the interlayer insulation layer 220, which can include a silicon oxide layer.

According to embodiments of the present invention, the self-aligned contact structure can be configured so that the exposed upper surfaces (the surfaces facing away from the substrate 100) of the gate electrode 160 are surrounded by the thin liner layers 200 and 260 on the upper perimeter, and the gate oxide layer 140 on the bottom or lower perimeter, such that a height of the gate electrode 160 can be lower than in certain conventional configurations. As a result, a deposition thickness of the interlayer insulation layer 220 can be reduced and production cost and time may also be reduced. In addition, the distance and/or spacing between neighboring gate electrodes 160 can increase due to the liner employing reduced space under a given minimum line width. Thus, contact resistance between the impurity diffusion region 180 and the self-aligned contact pad 300a can be improved. In addition, the upper portion of the gate electrode 160 can be surrounded by a thin (typically nitride) liner layer 200, 260, so that loading capacitance can be reduced.

FIG. 2 shows a schematic of a self-aligned contact structure in accordance with another exemplary embodiment of the present invention. Compared with FIG. 1, a buffer insulation layer 280a is further interposed between the second liner layer 260 disposed on the upper sidewall 240a of a self-aligned contact window 240 and a self-aligned contact pad 300a. The buffer insulation layer 280a can comprise silicon oxide. This configuration may allow the, loading capacitance to be even further reduced.

A method for forming the self-aligned contact structure will be explained with reference to FIGS. 3A through 3I. For brevity and/or clarity, only a few gate electrodes 160, one self-aligned contact window 240 and one contact pad 300a are illustrated in the drawings.

Figure 3A:
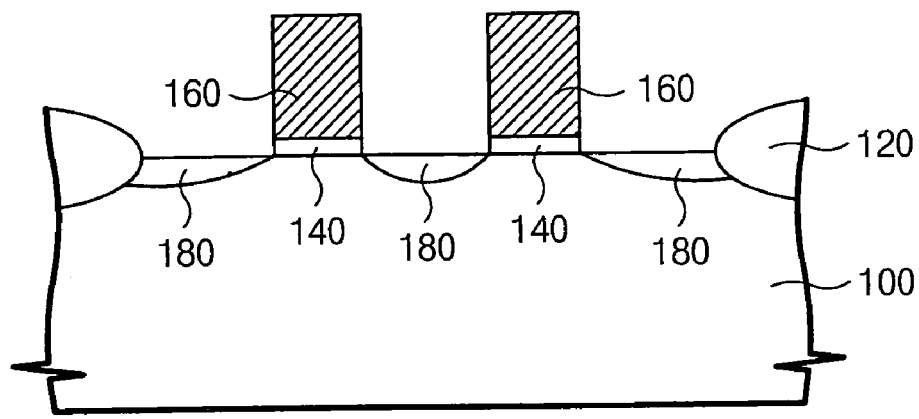
FIGS. 3A through 3I are cross-sectional views showing operations of a method for forming a self-aligned contact structure and/or other intermediate and resultant structures in accordance with embodiments of the present invention.

Referring to FIG. 3A, a device isolation layer 120 is formed in a semiconductor substrate 100 using a conventional method. For example, a shallow trench isolation (STI) method or a local oxidation of silicon (LOCOS) method can be employed.

A thermal oxidation process can be performed to form a gate oxide layer 140 on an entire target surface of the semiconductor substrate. Then, a conductive material is formed on the gate oxide layer 140 and the conductive material is patterned to form gate electrodes 160. The gate electrodes 160 are arranged to be parallel and spaced apart from each other by a predetermined distance (i.e., a distance corresponding to a minimum line width). For example, each of the gate electrodes 160 may comprise a polysilicon single-layered structure or a double-layered structure of polysilicon and tungsten silicide or polysilicon and tungsten that are sequentially stacked, respectively. In contrast to conventional methods, a capping nitride layer is not required to be formed on the gate electrodes 160.

The gate electrode 160 can comprise polysilicon, and the polysilican may be re-oxidized. Then, an ion implantation process can be performed using the gate electrodes 160 as an ion implantation mask in order to form a conductive region, i.e., impurity diffusion regions 180. The impurity diffusion regions 180 can be formed in the substrate on both sides of the gate electrodes 180.

Figure 3B:
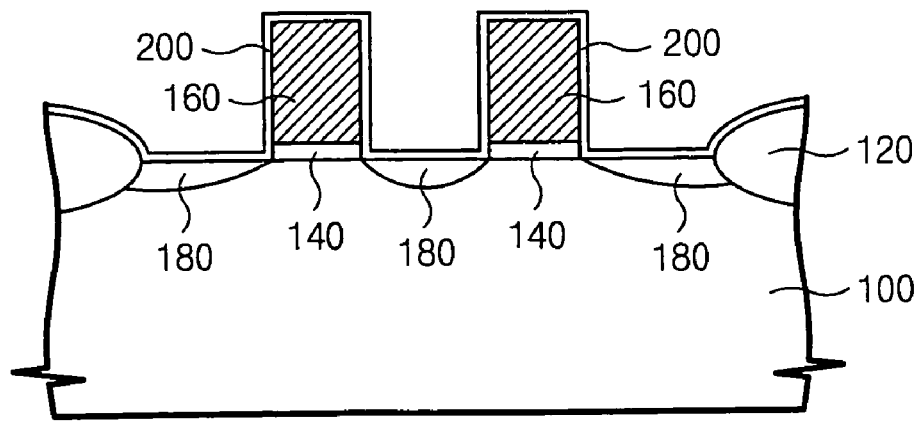

Next, referring to FIG. 3B, a liner layer 200 can be a substantially continuous layer that is formed over a semiconductor substrate 100, over the exposed upper surfaces of the gate electrodes 160, and over the impurity diffusion layer 180. The liner layer 200 comprises a material having etch selectivity with respect to the interlayer insulation layer 220 that will be formed in a subsequent process. For example, when the interlayer insulation layer 220 is formed of silicon oxide, the liner layer 200 can be formed of silicon nitride. In the present invention, sidewall spacers are not required to be formed on sidewalls of the gate electrode.

According to an exemplary embodiment, a thin silicon nitride layer is conformally formed as the liner layer 200. In contrast to previous methods, in certain embodiments, the liner layer 200 of the present invention can be configured as a thin layer having a thickness of, for example, about 100 Å or less. Therefore, contrary to the conventional method, the separation distance between adjacent gate structures (which in the past typically included spacers) can be about 300-500 Å or more under an identical design rule used in conventional configurations. This separation distance may improve contact resistance between the impurity diffusion layer 180 and a self-aligned contact pad (300a, FIG. 1) that will be formed in a subsequent process.

Figure 3C:
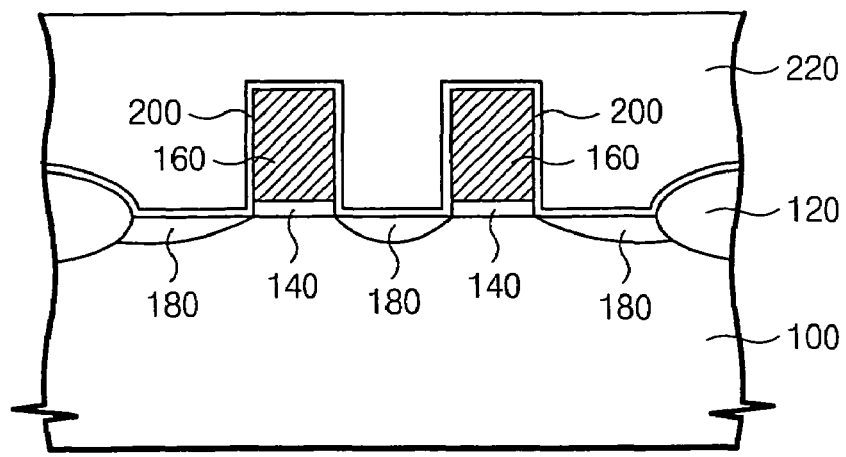

Referring to FIG. 3C, an interlayer insulation layer 220 is formed on the liner layer 200 in an amount sufficient to cover the space between the gate electrodes 160. In an exemplary embodiment, the interlayer dielectric layer 220 can be formed of silicon oxide. In particular embodiments, the interlayer dielectric layer 220 is formed of silicon oxide having good step coverage. A mask pattern, for example, a photoresist pattern (not shown) can be formed on the interlayer insulation layer 220. The pattern defines a self-aligned contact window (240, FIG. 1).

Figure 3D:
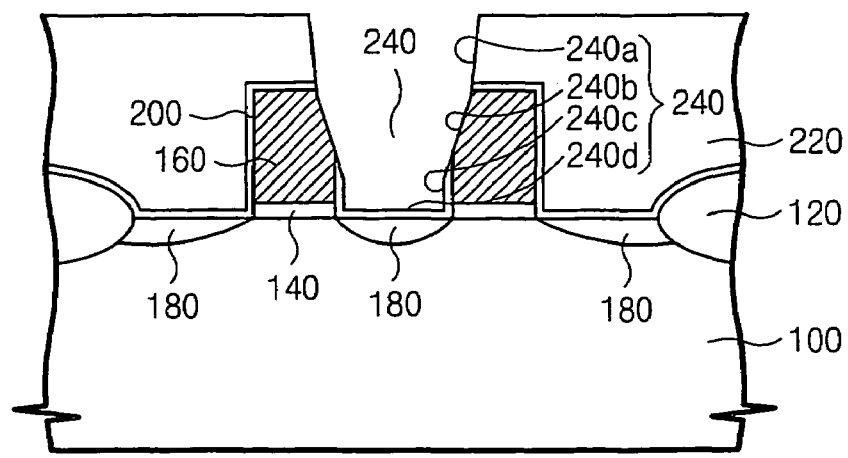

Referring to FIG. 3D, using the photoresist pattern as an etching mask, the exposed interlayer insulation layer 220 can be etched. In certain embodiments, the interlayer insulation layer 220 is selectively etched with respect to the liner layer 200 to form the self-aligned contact window 240. While the etching is performed, the thin liner layer 200 of a top edge of a respective gate electrode 160 may be weakened by repeated etching. Therefore, a top edge portion and an upper sidewall portion of the thin liner layer 200 on the gate electrode 160 is etched and then a corresponding portion of the exposed gate electrode 160 can be etched to provide an inclined profile at a respective top edge and upper sidewall (typically ending at an intermediate) portion of the gate electrode 160. Meanwhile, because the interlayer insulation layer 220 is selectively etched, the lower portion of the gate electrodes 160 and the liner layer 200 formed on the semiconductor substrate 100 therebetween remain intact (i.e., are not etched away). Therefore, the separation distance between the gate electrodes 160 can be substantially uniform, that is, a minimum substantially uniform line width can be generated.

The formed self-aligned contact window 240 may be described as having an upper sidewall 240a, a middle sidewall 240b, a lower sidewall 240c, and a bottom 240d. The upper sidewall 240a of the self-aligned contact window 240 is defined by the interlayer insulation layer 220. The middle sidewall 240b is defined by the sloped gate electrode (i.e., the upper sidewall portion of the gate electrode 160). The lower sidewall 240c is defined by the liner layer 200 residing over the lower sidewall of the gate electrode 160. The bottom 240d is defined by the liner layer 200 on the impurity diffusion region 180 between adjacent gate electrodes 160.

In the etching process for forming the self-aligned contact window 240, the upper sidewall portion of the gate electrode 160 can be etched to provide a sloped profile.

Figure 3E:
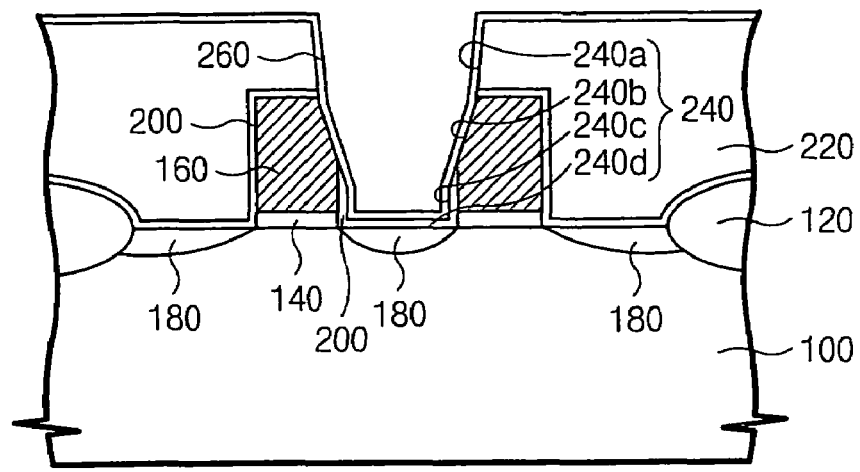

Referring to FIG. 3E, a gate protection liner layer 260 can be formed to cover the exposed upper portion of the gate electrode 160. Therefore, the exposed upper surfaces of the gate electrodes 160 can be completely covered and/or protected by the liner layers 200 and 260. As shown in FIG. 3E, the upper portion of the gate electrode 160 is covered by the gate protection liner layer 260 and the remaining portion of the upper surfaces of the gate electrode is protected by the liner layer 200. The gate shield protection layer 260 may be formed of the same material as the liner layer 200, for example, silicon nitride. In addition, the protection liner layer 260 can be formed to about 200 Å or less. As shown in FIG. 3E and FIG. 1, the gate protection liner layer 260 may overlie a lower portion of the liner layer 200 at a lower portion of the sidewall 240c.

Figure 3F:
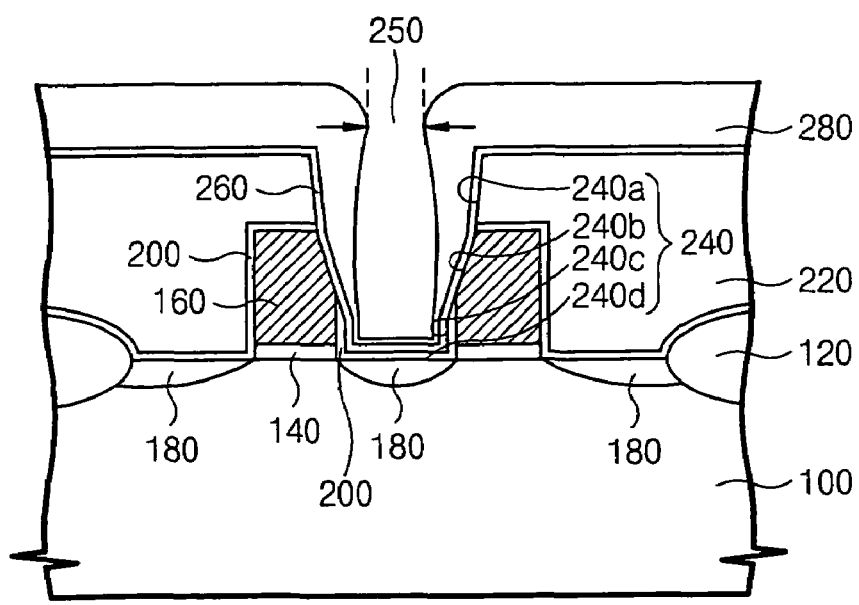
Figure 3G:
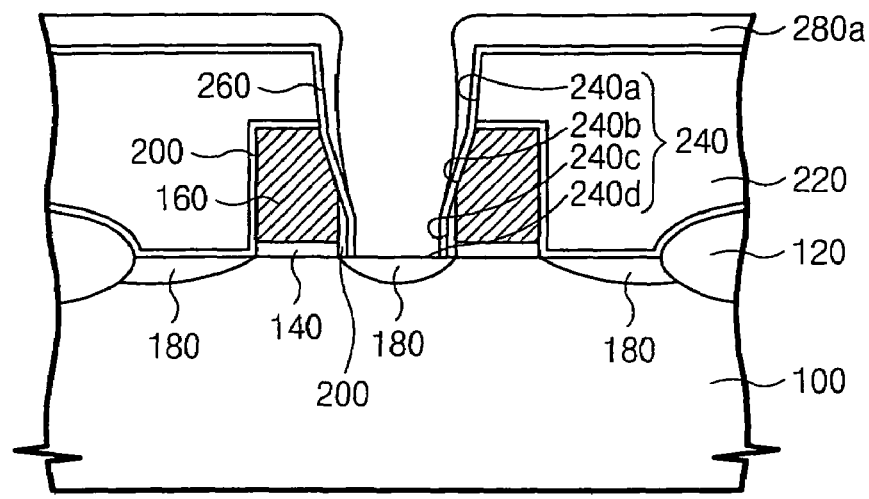

Next, referring to FIGS. 3F and 3G, liner layers 200 and 260 formed on the bottom of the contact window 240d can be removed to expose the impurity diffusion layer 180. First, referring to FIG. 3F, a buffer insulation layer 280 having relatively poor step coverage can be formed on the gate protection and/or shield liner layer 260 to cause overhang (i.e., the buffer insulation layer 280 material resides above the top of the gate and overhangs the contact window 240 to extend down into the contact window 240). The buffer insulation layer 280 can be formed of differential thickness along the window 240 so that it is relatively thin on the bottom 240d and lower sidewalls 240c of the self aligned contact window 240, but formed with increased thickness on the middle sidewall 240b and the upper sidewall 240a of the self-aligned contact window 240. An opening 250 in the buffer insulation layer 280 can extend downwardly to terminate substantially at and/or expose the bottom of the contact window 240d.

The buffer insulation layer 280 can be formed of silicon oxide using, for example, chemical vapor deposition. As described above, the upper part of the contact window 240b has a sloped profile, such that the overhang can be more easily formed.

Referring to FIG. 3G, an etch-back process can be applied to the stacked surface of the semiconductor substrate 100 holding the buffer insulation layer 280 (FIG. 3F). The buffer insulation layer 280 and the liner layers 200, 260 are simultaneously etched in the etch-back process. Thus, where the buffer insulation. layer 280 is configured sufficiently thin, the buffer insulation layer 280 and the liner layers 200, 260 thereunder are removed to expose the underlying material or surface, such as the impurity diffusion region 180. The thin portion of the buffer insulation layer 280 and the liner layers 200, 260 thereunder are on the bottom 240d of the contact window 240 that is exposed through the opening 250 defined by the buffer insulation layer 280. In this case, because the buffer insulation layer 280 is formed with increased thickness on the intermediate and upper portion of the sidewalls 240b, 240a, respectively of the contact window 240, a portion of the buffer insulation layer 280 can remain as a spacer 280a after the etch-back process is carried out to expose the impurity diffusion region 180. Accordingly, the residual buffer insulation layer 280a protects the liner layers 260 and/or 200 on the middle sidewalls 240c and the upper sidewall 240b of the contact window 240 so that the underlying liner(s) is not exposed during the etch-back process. The gate protection liner layer 260 is formed before a formation of a conductive layer 300. Therefore, even though voids may occur when the interlayer dielectric layer 220 is formed, electrical bridging is inhibited and/or prevented.

Depending on manufacturing processes employed and/or desired applications, the protection liner layer 260 may be etched.

Figure 3H:
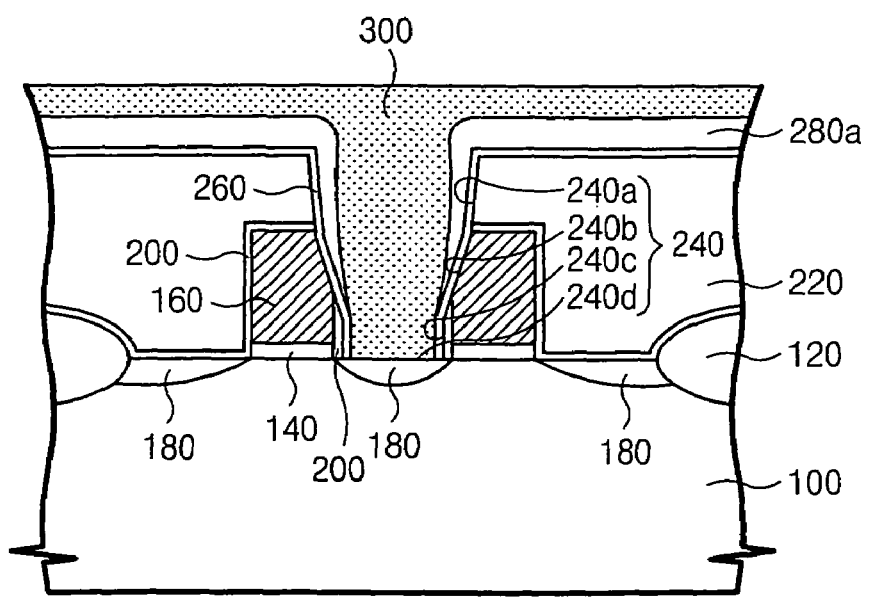
Figure 3I:
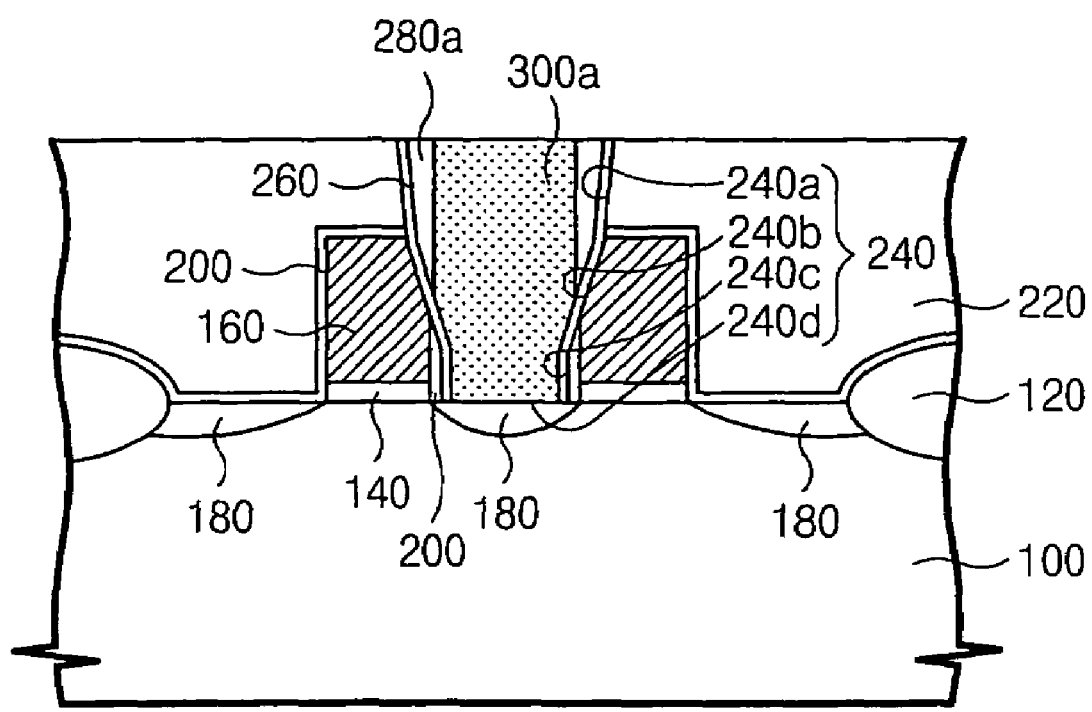

Referring to FIG. 3H, the contact window 240 is filled with conductive material 300. Subsequently, an etching process can be carried out to remove excess conductive material 300 until the interlayer insulation layer 220 is exposed at the upper part thereof. The etching process can be performed to form a self-aligned contact pad 300a as illustrated in FIG. 3I. The residual buffer insulation layer 280a may optionally be removed and then conductive material may be provided as a filler as desired. In this case, the cross-sectional size of the upper portion of the contact pad 300a increases, so that the subsequent process margin may also increase.

According to embodiments of the present invention for forming the self-aligned contact pads 300a, a capping layer and a spacer layer are not required to be formed on the upper portion and the sidewall of the gate electrode, respectively. This is an aspect that is contrary to the conventional method. Therefore, a silicide layer can be easily formed at the peripheral circuit area and the cell area where a memory device is formed at the same time.

Figure 4A:
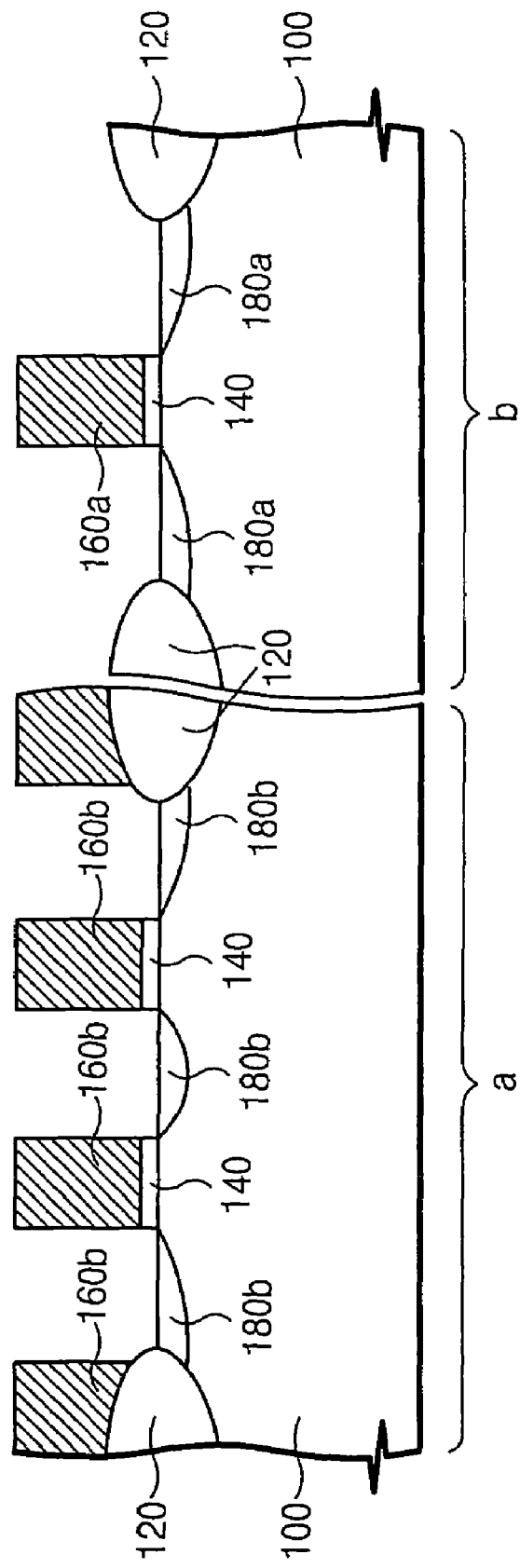

Referring to FIG. 4A, a device isolation process is illustrated to form a device isolation layer 120 that defines an active region in the semiconductor substrate 100 with a cell array region "a" and a peripheral circuit region "b". A gate oxide layer 140 is formed on a surface of the semiconductor substrate 100 by a thermal oxidation process. Then, a conductive layer for forming a gate electrode is formed on the gate oxide layer 140. The gate electrode conductive layer is patterned to form gate electrodes 160a and 160b at the cell array region "a" and the peripheral circuit region "b" of the semiconductor substrate 100, respectively. In the cell array region "a" the gate electrodes can be densely formed, but in the peripheral region "b" the gate electrodes may be formed more sparsely. The gate electrodes 160a and 160b comprise, for example, polysilicon.

After the gate electrodes 160a and 160b are formed, a re-oxidation process can be performed and then an ion implantation process can be carried out to form lightly doped impurity diffusion regions 180a and 180b in the semiconductor substrate 100 at both sides of the gate electrodes 160a and 160b in the respective regions a, b.

Figure 4B:
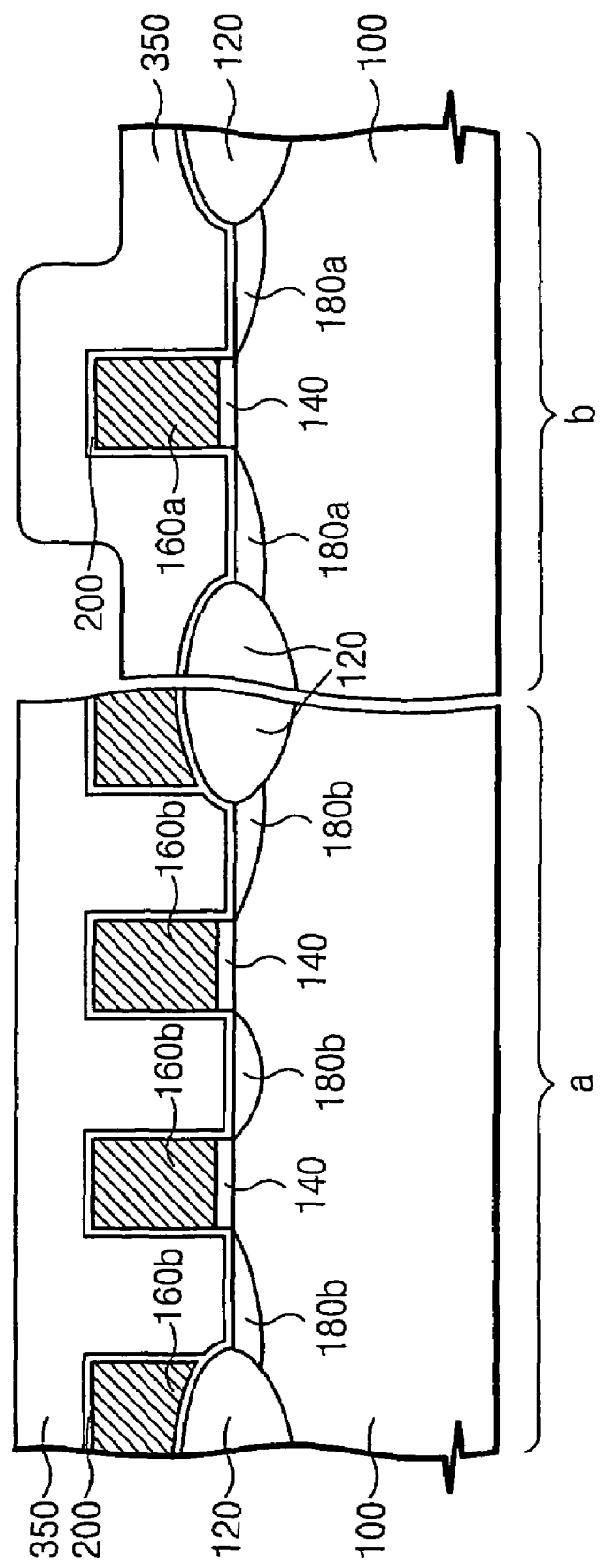

Referring to FIG. 4B, a liner layer 200 and a sacrificial insulation layer 350 are formed on target exposed surfaces of the semiconductor substrate 100 including over the gate electrodes 160b, 160a, and the impurity diffusion regions 180a, 180b. The liner layer 200 can comprise, for example, silicon nitride. The sacrificial insulation layer 350 can comprise, for example, silicon oxide.

The gate electrodes 160b can be densely formed at the cell region "a", so that the sacrificial insulation layer 350 completely covers the lower structures including the space between the gate electrodes 160b at the cell region "a", and have a substantially planar top surface. However, the sacrificial insulation layer 350 may be stepped to travel about the outline of the lower structure at the peripheral circuit region "b" with the sacrificial layer 350 at region "b" having the greatest height above the underlying top surface of the gate electrode 160a.

Figure 4C:
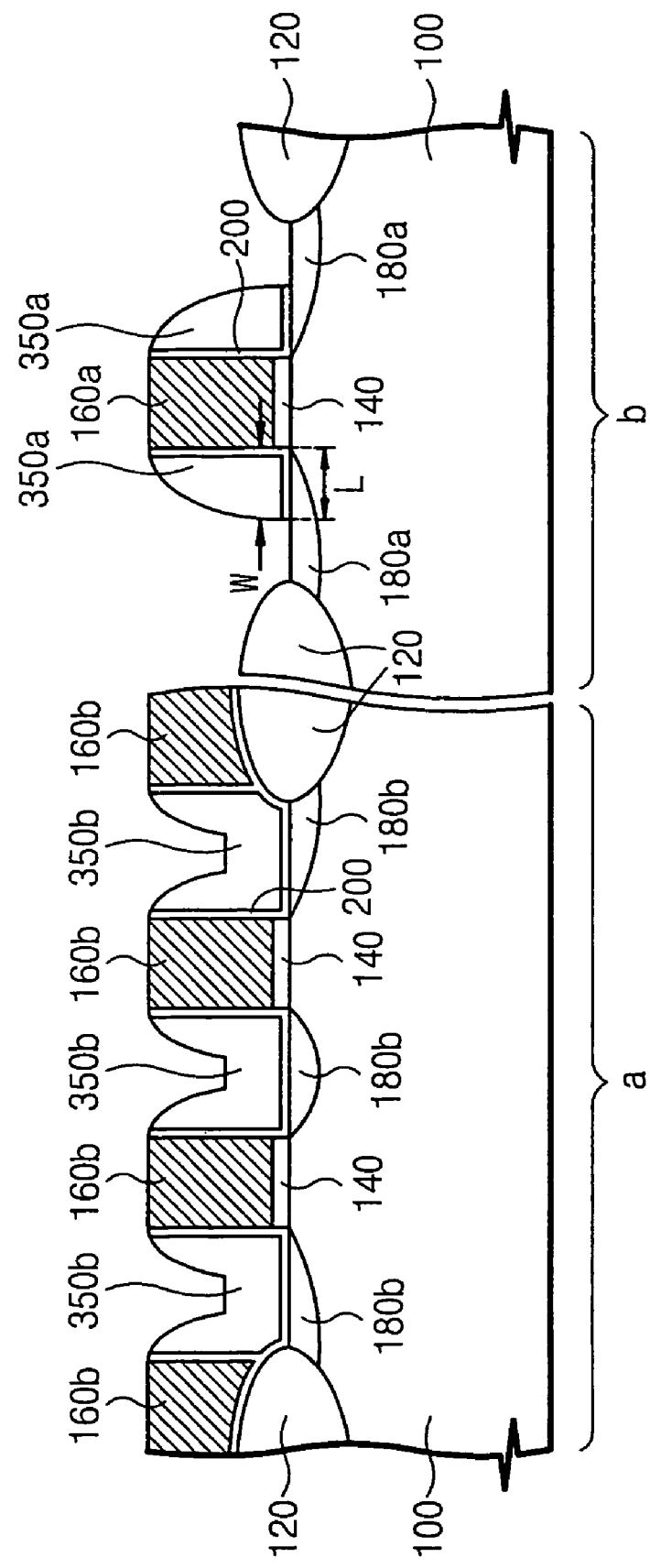

Referring to FIG. 4C, an etch-back process can be applied to the surface of the stacked semiconductor substrate with the sacrificial insulation layer 350 so that the sacrificial insulation layer 350 remains only on the sidewalls of the gate electrode 160a to form temporary sidewall spacers 350a at the peripheral circuit region "b". That is, a top of the gate electrode 160a of the peripheral circuit region "b" and portions of the lightly doped impurity diffusion regions 180a at both sides of the gate electrode 160a are exposed. In this case, the exposed lightly doped impurity diffusion regions 180a, in which a heavily doped impurity diffusion regions can be formed in a subsequent process, are separated from the gate electrode 160a as far as a predetermined distance (i.e., a width W of a temporary sidewall spacer 350a). In other words, the width W of the lower portion of the temporary sidewall spacers 350a determines a length L of the lightly doped impurity diffusion regions 180a that are covered with the temporary sidewall spacers 350a (the length L can correspond to the length of a final lightly doped impurity diffusion region).

Meanwhile, in the cell region "a", only the top of the gate electrode 160b is exposed by the etch-back process for the sacrificial insulation layer 350. The sacrificial insulation layer 350b still remains on the impurity diffusion region 180b at both opposing sides of the gate electrode 160b and on the sidewalls of the gate electrode 160b.

By adjusting the thickness of the sacrificial insulation layer 350, the thickness of the temporary spacers 350a at the peripheral region "b" can be adjusted. A distance between the exposed lightly doped impurity diffusion region 180a and the gate electrode 160a (i.e., the final length L of the lightly doped impurity diffusion region) can be controlled to a desired length/thickness.

Figure 4D:
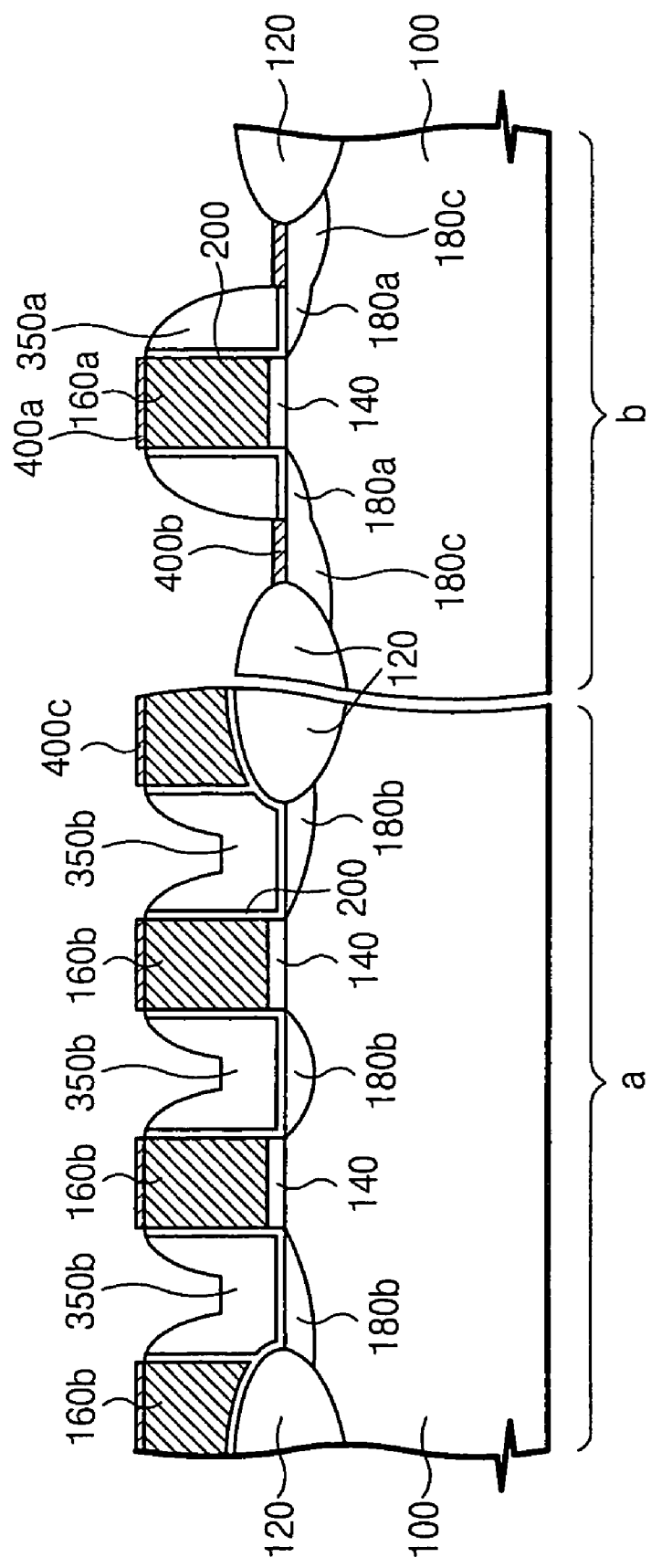

Referring to FIG. 4D, an ion implantation process is illustrated and may, in operation, be substantially continuously carried out. The gate electrodes 160a and 160b and the residual sacrificial insulation layer, i.e., a residual sacrificial insulation layer 350b at a cell region "a" and the temporary sidewall spacers 350a at the peripheral circuit region "b" are used as an ion implantation mask. Therefore, heavily doped impurity diffusion regions 180c can be formed at the peripheral circuit region "b". The heavily doped impurity diffusion regions 180c continue to the lightly doped impurity diffusion regions 180a at both sides of the gate electrodes 160a. The lightly doped impurity diffusion regions 180a are formed in the semiconductor substrate 100 under the temporary sidewall spacers 350a. In addition, impurity diffusion ions can be implanted into the upper or top portion of the exposed gate electrodes 160a and 160b. That is, gate electrodes 160a and 160b can be concurrently doped while the heavily doped impurity diffusion regions 180c are formed.

In certain embodiments, the cell region "a" and the peripheral circuit region "b" can include, for example, NMOS transistors. The gate electrodes (not shown) for a PMOS transistor, which can be formed in the peripheral circuit region "b", can be covered with a photoresist pattern and the top thereof may be protected. Similarly, the gate electrodes 160a and 160b can be protected by the photoresist pattern during an ion implantation process for the gate electrode of a PMOS transistor.

Still referring to FIG. 4D, silicide (or other desired material) layers 400a, 400b and 400c can be substantially concurrently formed on top of the gate electrode 160a of the exposed peripheral circuit region "b", on the heavily doped impurity diffusion regions 180c, and on the exposed gate electrodes 160b of the exposed cell region "a", respectively. In certain embodiments, a refractory metal having a relatively high melting point can be conformably formed and then thermally treated to cause a silicidation reaction between silicon and the refractory metal in order to form a silicide layer 400a, 400b and/or 400c. In operation, the non-reacting refractory metal can be removed in an automated manner.

Referring to FIG. 4E, the residual sacrificial oxide layers 350a and 350b are removed and then a silicide shield liner layer 420 can be formed on an entire exposed surface of the stacked semiconductor substrate for protecting silicide layers 400a, 400b, 400c. The silicide protection liner layer 420 can comprise silicon nitride. The silicide protection liner layer 420 is optional and may be excluded. In certain embodiments, typically depending on processes, a portion of the sacrificial oxide layer 350a remaining at the peripheral circuit region "b" may remain. That is, a portion of sidewall spacers 350a may remain.

Figure 4F:
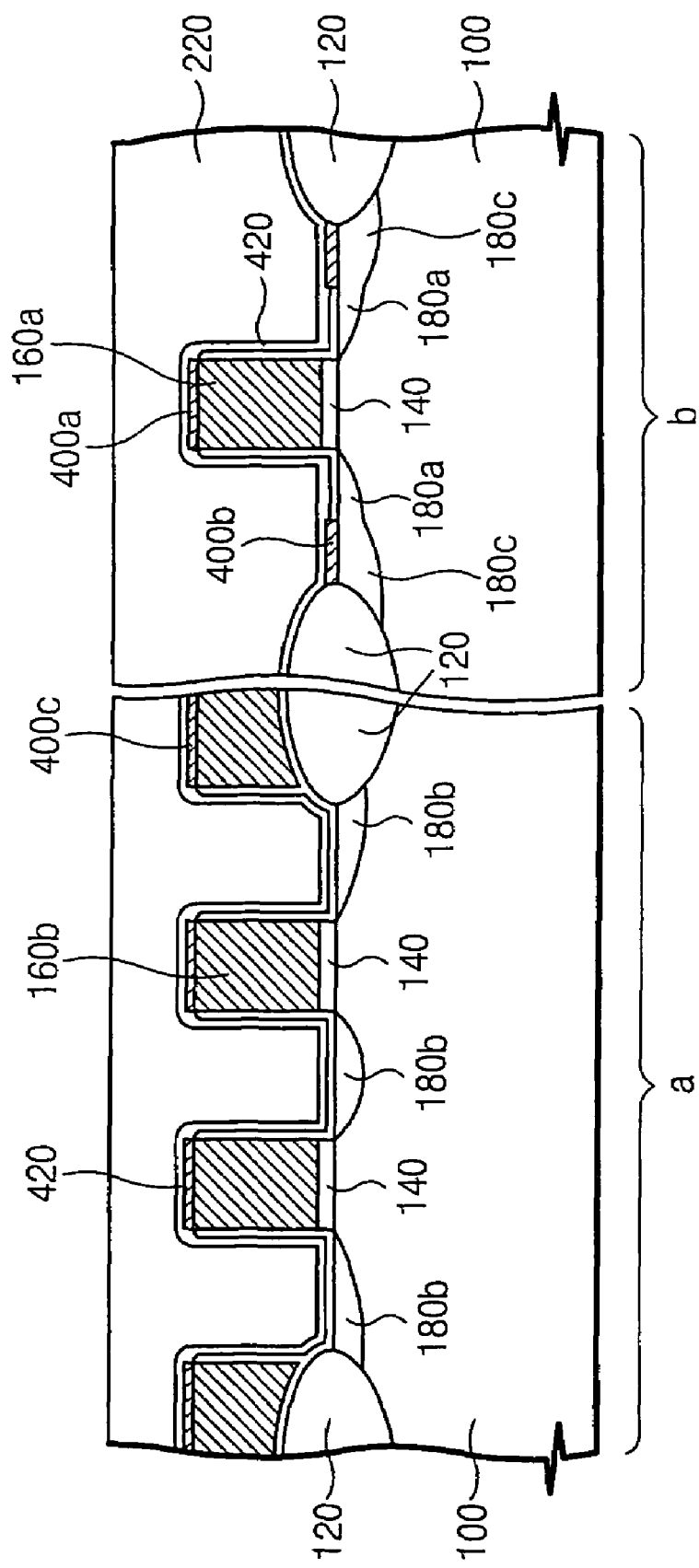

Referring to FIG. 4F, an interlayer insulation layer 220 is formed on the silicide protection liner layer 420. The interlayer insulation layer 220 can be provided so that it has a planar top surface as shown. That is to say, an interlayer insulation layer 220 can be stacked relatively thick and then a chemical mechanical polishing (CMP) process, an etch-back or other suitable process can be performed to planarize this layer 220. The interlayer insulation layer 220 is formed of material having etch selectivity with respect to the liner layer 200 and the silicide protection liner layer 420. For example, the interlayer insulation layer 220 can comprise and/or be formed of silicon oxide having good step coverage.

The subsequent processes can be carried out in the same way as that explained above with reference to FIGS. 3D through 3I. Referring to FIG. 4G, in certain embodiments, the interlayer insulation layer 220 on the cell region "a" can be etched to form a self-aligned contact window 240. In this case, as mentioned above, the gate electrodes 160b of the cell region "a" are etched to slope at an upper portion thereof.

Referring to FIG. 4H, a gate shield liner layer 260 and a buffer insulation layer 280 can be formed in the same way as the method mentioned above.

Figure 4I:
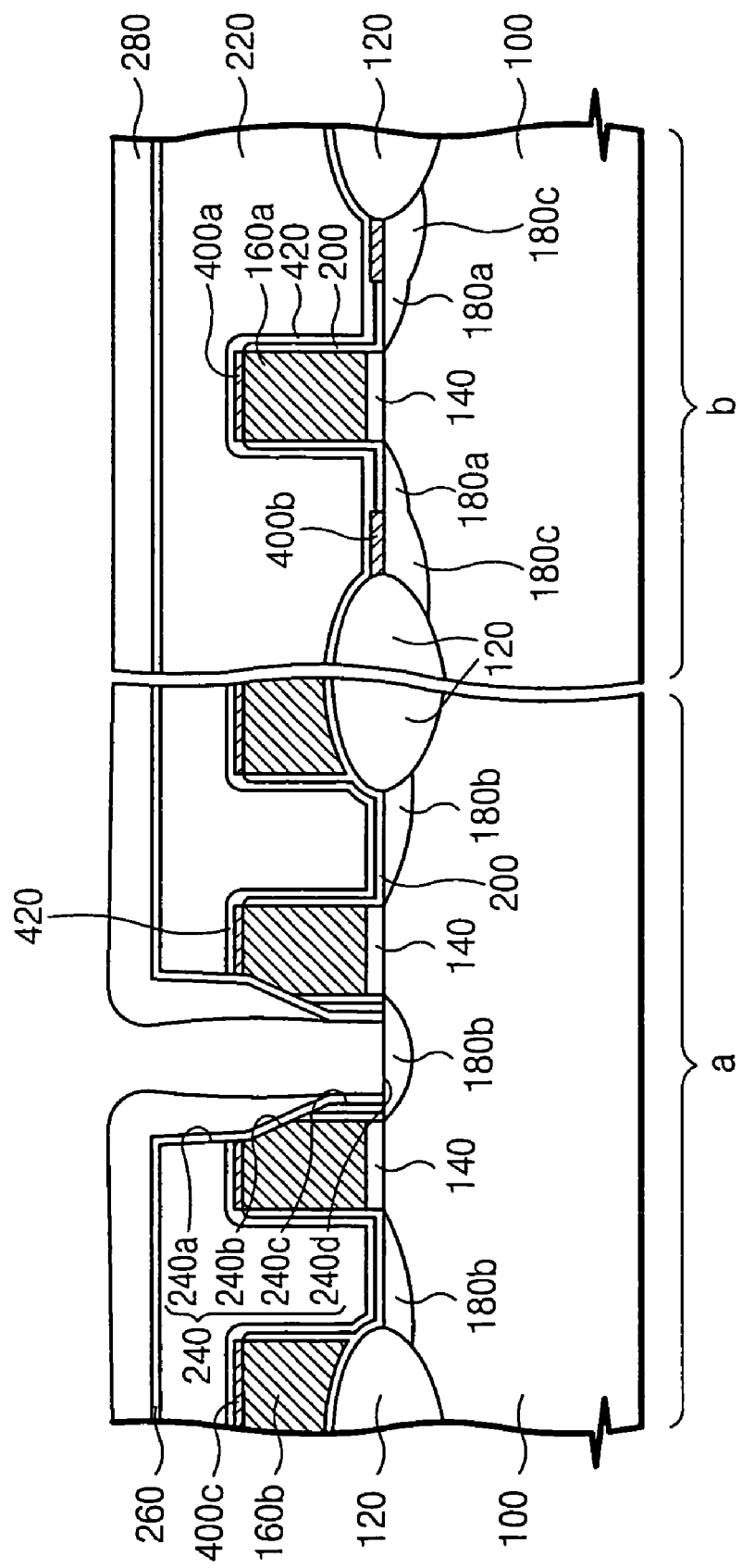

Referring to FIG. 4I, an etch-back process can be applied to the surface of the stacked semiconductor substrate with the buffer insulation layer 280, so that liner layers 200, 260, 420 on a bottom 240d of the contact window 240 are removed to expose a lightly doped impurity diffusion region 180b.

Figure 4J:
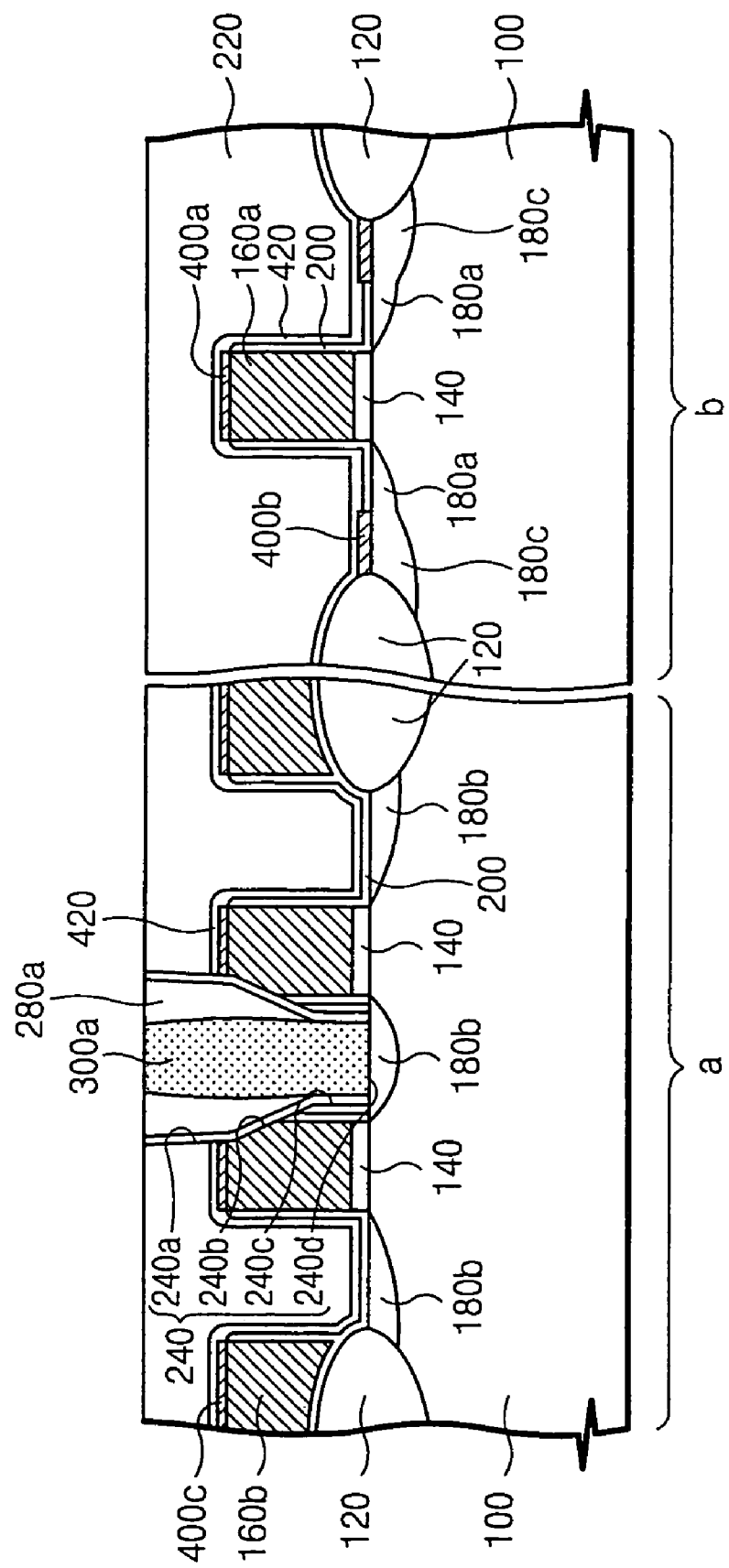

Referring to FIG. 4J, conductive material is provided to the window 240 and formed therein, then an etching process is performed to form a self-aligned contact pad 300a.

Figure 5B:
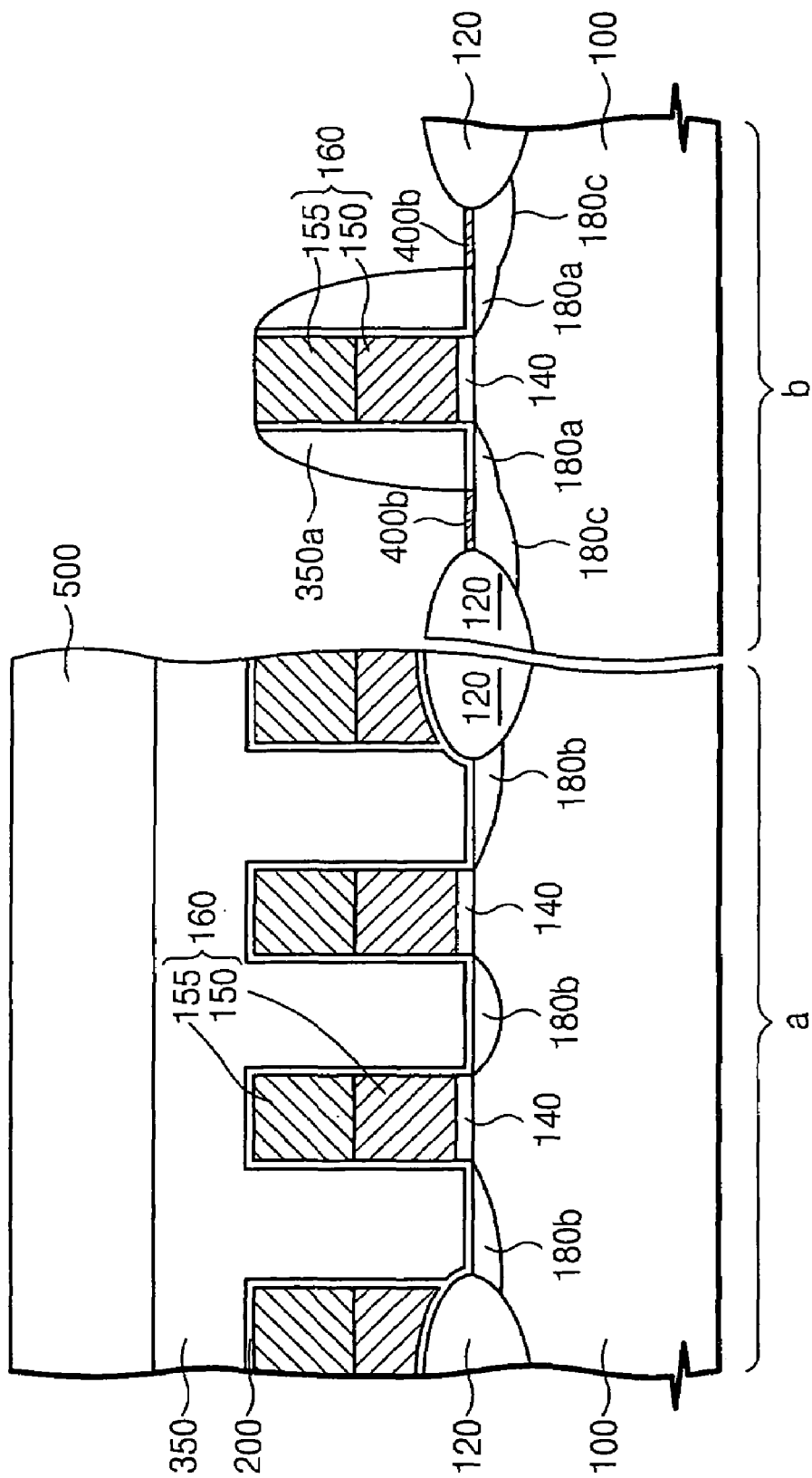

As shown in FIG. 5A, in certain embodiments, the gate electrode 160 may comprise two sequentially stacked layers of different materials, such as, for example, polysilicon 150 and tungsten silicide 155 or polysilicon 150 and tungsten 155, instead of forming the gate electrode 160 with polysilicon as described for certain embodiments of FIG. 4A. In the embodiment illustrated in FIG. 5B, a silicide layer 400b can be formed to overly substantially only the heavily doped impurity diffusion regions 180c that are formed in the semiconductor substrate 100 at both sides of the gate electrode 160a at the peripheral region "b" (i e., the top silicide layer 400a is not necessary).

In certain embodiments, after forming the sacrificial insulation layer 350, an etch-back process can be applied to a stacked surface of the semiconductor substrate. In particular embodiments, the etch back process may be performed after forming a photoresist pattern 500 covering the cell region "a", as illustrated FIGS. 5A and 5B.

In particular embodiments, described with reference to FIG.5A, a gate electrode 150 is formed with a multi-layered structure of polysilicon 150 and tungsten silicide 155 or of polysilicon 150 and tungsten 155. Then, lightly doped impurity diffusion regions 180a and 180b are formed by an ion implantation process, and a buffer insulation layer 350 is formed.

Referring to FIG. 5B, a photoresist pattern 500 that covers a cell region "a" is formed, and then an etch-back process can be performed to form temporary sidewall spacers 350a on sidewalls of the gate electrode 160b at the peripheral circuit region "b". Then, heavily doped impurity diffusion regions 180c can be formed in the peripheral region "b" by an ion implantation process.

Next, the photoresist pattern 500 and residual buffer insulation layers 350 and 350a are removed. In this case, the top of the gate electrode 160b is not exposed at a cell region "a", such that a silicide layer 400b is formed substantially only at the peripheral circuit region "b".

In particular embodiments, the operations shown in FIGS. 4E through 4J can be substantially continuously serially performed in an automated mass production process.

Embodiments of the present invention may provide one or more of the following advantages compared to conventional self-aligned contact processes. In addition, although described above with respect to semiconductor substrates and devices, the present invention is directed to integrated circuits and can include structures formed on other substrates.

In typical conventional methods, undesired electrical bridging may occur in a subsequent process for forming a self-aligned contact pad due to voids that may be formed while an interlayer insulation layer is deposited. However, embodiments of the present invention reduce the likelihood that voids will be present when the interlayer insulation layer is formed because the sidewall spacers and the capping layer are not formed. In addition, if voids occur, electrical bridging can be inhibited because a nitride liner can be formed.

Further, in the typical conventional methods, the gate electrode stacked structure is relatively high and the distance between the gate electrodes is narrow, such that the halo ion implantation is difficult to apply. However, in embodiments of the present invention, the spacing is such that halo ion implantation can be used. In addition, the gate electrode of the present invention can be configured with a relatively low height, so that the interlayer insulation layer can be lowered in a thickness. As a result, production cost may be reduced and/or the throughput can be improved.

Further, in conventional methods, loading capacitance may be relatively large due to the presence of a capping nitride layer and a space nitride layer. In certain embodiments of the present invention, the loading capacitance is reduced and relatively small because of the generation of a nitride liner, thereby potentially providing improved device operational characteristics.

As noted above, in typical conventional fabrication methods, the distance between neighboring gate electrodes may be relatively narrow owing to the use of a spacer nitride layer making it difficult to generate sufficient self-aligned contact resistance, and integration is not easy. In contrast, in embodiments of the present invention, the self-aligned contact resistance can be more easily preserved and integration can be easier.

Still further, conventional fabrication methods may have difficulties forming a silicide layer at the cell region and the peripheral region at the same time. In certain embodiments of the present invention, the silicide layer can be simultaneously formed at the cell region and the peripheral region. Moreover, the thickness of the sidewall spacers of the gate electrode at the peripheral region may be more easily controlled.

While the present invention has been described in connection with embodiments thereof, it is capable of various changes and modifications without departing from the spirit and scope of the invention. It should be appreciated that the scope of the invention is not limited to the detailed description of the invention hereinabove, which is intended merely to be illustrative, of the examples of subject matter encompassed by the following claims.

That which is claimed is:

1. A semiconductor device, comprising:
   first and second gate electrodes in a cell array region of a substrate and a third gate electrode in a peripheral region of the substrate, each gate electrode having opposing first and second sidewalls and a top surface, each of the first and second gate electrodes having an upper portion which is narrower than a bottom portion;
   a first impurity diffusion region in the cell array region between the first and second gate electrodes;
   a second impurity diffusion region in the peripheral region adjacent to the third gate electrode;
   a first silicide layer on the second impurity diffusion region;
   a silicon nitride liner on the sidewalls and on the top surface of each gate electrode; and
   a self-aligned contact pad between the first and second gate electrodes to be electrically connected to the first impurity diffusion region,
   wherein the first sidewalls of the first and second gate electrodes are adjacent to the self-aligned contact pad, wherein the upper portions of the first sidewalls of the respective first and second gate electrodes angle toward each other to present a sloped profile, and wherein the second sidewalls of the first and second gate electrodes are substantially vertical.

2. The device of claim 1, further comprising a second silicide layer on the top surface of each gate electrode.

3. The device of claim 1, wherein the second impurity diffusion region comprises a first part being adjacent to the third gate electrode and a second part being spaced apart from the third gate electrode and adjacent to the first part.

4. The device of claim 3, wherein the first silicide layer is formed on the second part of the second impurity diffusion region and the silicon nitride liner is in direct contact with the first part of the second impurity diffusion region.

5. A semiconductor device, comprising:
   first and second gate electrodes in a cell array region of a substrate and a third gate electrode in a peripheral region of the substrate, each gate electrode having opposing first and second sidewalls and a top surface, each of the first and second gate electrodes having an upper portion which is narrower than a bottom portion;
   a first impurity diffusion region in the cell array region between the first and second gate electrodes;
   a second impurity diffusion region in the peripheral region adjacent to the third gate electrode;
   a first silicide layer on the second impurity diffusion region;
   a silicon nitride liner on the sidewalls and on the top surface of each gate electrode; and
   a self-aligned contact pad between the first and second gate electrodes to be electrically connected to the first impurity diffusion region,
   wherein the silicon nitride liner is in direct contact with the first impurity diffusion region in the cell array region and in direct contact with the first silicide layer in the peripheral region.

6. The device of claim 1, wherein the self-aligned contact pad protrudes from the top surfaces of the first and second gate electrodes.

7. A semiconductor device, comprising:
   first and second gate electrodes in a cell array region of a substrate and a third gate electrode in a peripheral region of the substrate, each gate electrode having opposing first and second sidewalls and a top surface, each of the first and second gate electrodes having an upper portion which is narrower than a bottom portion;
   a first impurity diffusion region in the cell array region between the first and second gate electrodes;
   a second impurity diffusion region in the peripheral region adjacent to the third gate electrode;

a first silicide layer on the second impurity diffusion region;

a silicon nitride liner on the sidewalls and on the top surface of each gate electrode;

a self-aligned contact pad between the first and second gate electrodes to be electrically connected to the first impurity diffusion region; and a buffer insulating layer between the silicon nitride liner and the self-aligned contact pad at the top portions of the first and second gate electrodes, wherein the first and the second gate electrode are configured so that respective first sidewalls at the respective upper portions angle toward each other to present a sloped profile and respective second sidewalls are substantially vertical.

8. The device of claim 7, wherein the buffer layer comprises a silicon oxide layer.

9. A semiconductor device, comprising:

first and second gate electrodes in a cell array region of a substrate and a third gate electrode in a peripheral region of the substrate, each gate electrode having opposing first and second sidewalls and a top surface, each of the first and second gate electrodes having an upper portion which is narrower than a bottom portion;

a first impurity diffusion region in the cell array region between the first and second gate electrodes;

a second impurity diffusion region in the peripheral region adjacent to the third gate electrode;

a first silicide layer on the second impurity diffusion region; and a silicon nitride liner on the sidewalls and on the top surface of each gate electrode;

a self-aligned contact pad between the first and second gate electrodes to be electrically connected to the first impurity diffusion region;

wherein the first and the second gate electrode are configured so that respective first sidewalls at the respective upper portions angle toward each other to present a sloped profile and respective second sidewalls are substantially vertical, and wherein the silicon nitride liner in the bottom portion of the first and second gate electrodes comprises first and second silicon nitride liners which in combinations are thicker than the silicon nitride liner at the bottom portion of the third gate electrode.

10. A semiconductor device, comprising:

first and second gate electrodes in a cell array region of a substrate and a third gate electrode in a peripheral region of the substrate, each gate electrode having opposing first and second sidewalls and a top surface, each of the first and second gate electrodes having an upper portion which is narrower than a bottom portion;

a first impurity diffusion region in the cell array region between the first and second gate electrodes;

a second impurity diffusion region in the peripheral region adjacent to the third gate electrode;

a first silicide layer on the second impurity diffusion region; and a plurality of silicon nitride liners residing on at least some portions of the sidewalls and the top surface of each gate electrode;

a self-aligned contact pad between the first and second gate electrodes to be electrically connected to the first impurity diffusion region;

wherein the first and the second gate electrode are configured so that respective first sidewalls at the respective upper portions angle toward each other to present a sloped profile and respective second sidewalls are substantially vertical, and wherein first and second silicon nitride liners of the plurality of silicon nitride liners are arranged so that they each directly contact portions of the sidewalls of the first and second gate electrodes and so that the sidewalls of the first and second gate electrodes are completely covered by the first and second silicon nitride liners.

11. A semiconductor device, comprising:

first and second gate electrodes in a cell array region of a substrate and a third gate electrode in a peripheral region of the substrate, each gate electrode having opposing first and second sidewalls and a top surface, wherein the first sidewalls of the first and second gate electrodes have respective upper portions that angle toward each other to present a sloped profile and the second sidewalls of the first and second gate electrodes are substantially vertical;

a first impurity diffusion region in the cell array region between the first and second gate electrodes;

a second impurity diffusion region in the peripheral region adjacent to the third gate electrode;

a third impurity diffusion region in the peripheral region which resides a further distance away from the third gate electrode and abuts the second impurity diffusion region;

a silicide layer on the third impurity diffusion region and on a top surface of each gate electrode;

a silicon nitride liner on the sidewalls of each of the gate electrodes and on the silicide layer which is positioned on the top surface of each gate electrode; and a self-aligned contact pad between the first and second gate electrodes to be electrically connected to the first impurity diffusion region, the self-aligned contact pad protruding from the top surfaces of the first and second gate electrodes, wherein the first sidewalls of the first and second gate electrodes are adjacent to the self-aligned contact pad.

12. A semiconductor device, comprising:

first and second gate electrodes in a cell array region of a substrate and a third gate electrode in a peripheral region of the substrate, each gate electrode having opposing first and second sidewalls and a top surface, wherein the first sidewalls of the first and second gate electrodes have respective upper portions that angle toward each other to present a sloped profile and the second sidewalls of the first and second gate electrodes are substantially vertical;

a first impurity diffusion region in the cell array region between the first and second gate electrodes;

a second impurity diffusion region in the peripheral region adjacent to the third gate electrode;

a third impurity diffusion region in the peripheral region which resides a further distance away from the third gate electrode and abuts the second impurity diffusion region;

a silicide layer on the third impurity diffusion region and on a top surface of each gate electrode;

a silicon nitride liner on the sidewalls of each of the gate electrodes and on the silicide layer which is positioned on the top surface of each gate electrode;

a self-aligned contact pad between the first and second gate electrodes to be electrically connected to the first impurity diffusion region, the self-aligned contact pad protruding from the top surfaces of the first and second gate electrodes; and a silicon oxide layer between the silicon nitride liner and the self-aligned contact pad at the top portions of the first and second gate electrodes.

13. A semiconductor device, comprising:

first and second gate electrodes in a cell array region of a substrate and a third gate electrode in a peripheral region of the substrate, each gate electrode having opposing first and second sidewalls and a top surface, wherein the first sidewalls of the first and second gate electrodes have respective upper portions that angle toward each other to present a sloped profile and the second sidewalls of the first and second gate electrodes are substantially vertical;

a first impurity diffusion region in the cell array region between the first and second gate electrodes;

a second impurity diffusion region in the peripheral region adjacent to the third gate electrode;

a third impurity diffusion region in the peripheral region which resides a further distance away from the third gate electrode and abuts the second impurity diffusion region;

a silicide layer on the third impurity diffusion region and on a top surface of each gate electrode;

a silicon nitride liner on the sidewalls of each of the gate electrodes and on the silicide layer which is positioned on the top surface of each gate electrode; and a self-aligned contact pad between the first and second gate electrodes to be electrically connected to the first impurity diffusion region, the self-aligned contact pad protruding from the top surfaces of the first and second gate electrodes;

wherein the silicon nitride liner in a bottom portion of the first and second gate electrodes comprises first and second silicon nitride liners which in combinations are thicker than the silicon nitride liner at a bottom portion of the third gate electrode.

14. A semiconductor device, comprising:

first and second gate electrodes in a cell array region of a substrate and third gate electrode in a peripheral region of the substrate, each gate electrode having opposing first and second sidewalls and a top surface, wherein the first sidewalls of the first and second gate electrodes have respective upper portions that angle toward each other to present a sloped profile and the second sidewalls of the first and second gate electrodes are substantially vertical;

a first impurity diffusion region in the cell array region between the first and second gate electrodes;

a second impurity diffusion region in the peripheral region adjacent to the third gate electrode;

a first silicide layer on the second impurity diffusion region;

a silicon nitride liner on the sidewalls and the top surface of each gate electrode; and a self-aligned contact pad between the first and second gate electrodes to be electrically connected to the first impurity diffusion region, the self-aligned contact pad protruding from the top surfaces of the first and second gate electrodes, wherein the silicon nitride liner is in direct contact with the first impurity diffusion region and in direct contact with the first silicide layer.

15. The device of claim 14, further comprising a second silicide layer on the top surface of each gate electrode.

16. The device of claim 14, wherein the second impurity diffusion region comprises a first part being adjacent to the third gate electrode and a second part being spaced apart from the third gate electrode and adjacent to the first part.

17. The device of claim 16, wherein the first silicide layer is formed on the second part of the second impurity diffusion region and the silicon nitride liner is in direct contact with the first part of the second impurity diffusion region.

* * * * *